(12) United States Patent  (10) Patent No.: US 7,749,919 B2
Sakuma et al.  (45) Date of Patent: Jul. 6, 2010

(54) SEMICONDUCTOR DEVICE AND METHOD FOR MANUFACTURING THE SAME

(75) Inventors: Kiwamu Sakuma, Yokohama (JP); Daisuke Matsushita, Hiratsuka (JP); Koichi Kato, Yokohama (JP); Yasushi Nakasaki, Yokohama (JP); Izumi Hirano, Yokohama (JP); Kouichi Muraoka, Sagamihara (JP); Yuichiro Mitani, Kanagawa-Ken (JP); Shigeto Fukatsu, Yokohama (JP); Toshihide Ito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 11/896,860

(22) Filed: Sep. 6, 2007

(65) Prior Publication Data

US 2008/0173927 A1  Jul. 24, 2008

(30) Foreign Application Priority Data

Jan. 22, 2007  (JP)  ............................. 2007-011698

(51) Int. Cl.
*H01L 21/321*  (2006.01)
(52) U.S. Cl. ................ 438/775; 438/791; 257/E21.302
(58) Field of Classification Search ................ 438/775, 438/791; 257/E21.302
See application file for complete search history.

(56) References Cited

U.S. PATENT DOCUMENTS 6,007,789 A * 12/1999 Edler .......................... 423/344
6,060,403 A *  5/2000 Yasuda et al. ................ 438/765
6,252,296 B1 *  6/2001 Umeda et al. ................ 257/639
2003/0052377 A1 *  3/2003 Weimer ....................... 257/411
2005/0064667 A1    3/2005 Matsushita et al.
2005/0106894 A1 *  5/2005 Aoki et al. .................. 438/769

(Continued)

FOREIGN PATENT DOCUMENTS

JP  2006-120848  5/2006

(Continued)

OTHER PUBLICATIONS

Riley, Silicon Nitride and Related Materials, J. Am. Ceram. Soc., 83 [2] pp. 245-265 (2000).*

(Continued)

*Primary Examiner*—David Vu
*Assistant Examiner*—Earl N Taylor
(74) *Attorney, Agent, or Firm*—Finnegan, Henderson, Farabow, Garrett & Dunner, L.L.P.

(57) ABSTRACT

A semiconductor device includes: a semiconductor substrate; a source region and a drain region formed at a distance from each other in the semiconductor substrate; a first insulating film formed on a portion of the semiconductor substrate, the portion being located between the source region and the drain region; a charge storage film formed on the first insulating film; a second insulating film formed above the charge storage film and made of a high-permittivity material; a control gate electrode formed above the second insulating film; and a silicon nitride layer including nitrogen atoms having three-coordinate nitrogen bonds, at least one of second-nearest neighbor atoms of the nitrogen atoms being a nitrogen atom. At least one of the charge storage film and the control gate electrode contains silicon, the silicon nitride layer is located between the second insulating film and the at least one of the charge storage film and the control gate electrode.

20 Claims, 29 Drawing Sheets

U.S. PATENT DOCUMENTS

2006/0105582 A1* 5/2006 Aoki et al. .................. 438/786
2007/0034930 A1* 2/2007 Bhattacharyya ............. 257/314

FOREIGN PATENT DOCUMENTS

JP       2007-123825       5/2007
WO       WO 2007037094 A1 * 4/2007

OTHER PUBLICATIONS

Wang et al., Review Silicon Nitride Crystal Structure and Observations of Lattice Defects, Journal of Materials Science, 31, pp. 5281-5298 (1996).*

Matsushita, D. et al., "Method for Manufacturing a Semiconductor Device," U.S. Appl. No. 11/547,691, filed Oct. 6, 2006.

Guo, X. et al., "High Quality Ultra-Thin (1.5nm) $TiO_2/Si_3N_4$ Gate Dielectric for Deep Sub-Micron CMOS Technology," IEDM Tech. Dig., p. 137, 2 sheets, (1999).

Matsushita, D. et al., "Dramatic Improvement of $V_{fb}$, Shift and $G_m^{max}$ with Ultra-Thin and Ultra-Low Leakage SiN-Based SiON Gate Dielectrics," IEDM, p. 847, 4 sheets, (2005).

Lu, X. B. et al., "Field-Effect Transistors with $LaAlO_3$ and $LaAlO_xN_y$ Gate Dielectrics Deposited by Laser Molecular-Beam Epitaxy," Applied Physics Letters, vol. 85, No. 16, pp. 3543-3545, (Oct. 18, 2004).

Sivasubramani, P. et al., "Outdiffusion of La and Al from Amorphous $LaAlO_3$ in Direct Contact with Si (001)," Applied Physics Letters, vol. 86, pp. 201901-1 to 201901-3, (2005).

* cited by examiner

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2007-11698 filed on Jan. 22, 2007 in Japan, the entire contents of which are incorporated herein by reference.

BACKGROUND OF THE INVENTION

1. Field of the Invention

The present invention relates to a semiconductor device and a method for manufacturing the semiconductor device.

2. Related Art

Semiconductor devices have elicited high performance through device miniaturization. As for insulating films, materials (high-permittivity (high-k) materials) with higher relative permittivity than the relative permittivity of conventional silicon oxide films are being used so as to further reduce the film thickness.

For example, in a nonvolatile semiconductor memory device that can perform electric writing and erasing (a EEPROM), the use of a high-permittivity insulator for the blocking layer (the interelectrode insulating film) formed between the floating gate electrode and the control gate electrode is being considered, so as to reduce the device size and increase the coupling ratio between the floating gate electrode and the control gate electrode. One example of such a high-permittivity insulator is $LaAlO_x$, which has high permittivity $\in$(approximately 23), and has a wide band gap while maintaining the high permittivity. Having high stability and not easily forming a low-permittivity layer, $LaAlO_x$ is also considered to be suitable for the film to be formed on a Si film.

Recently, however, there have been reports of the problem that mutual diffusion is caused between the $LaAlO_x$ layer and the polycrystalline Si layer used as the floating gate electrode in a stack structure, where high-temperature heat treatment is carried out (see FIG. 1 in "Field-effect transistors with $LaAlO_3$ and $LaAlO_xN_y$ gate dielectrics deposited by laser molecular-beam epitaxy" by X. B. Lu et al., Applied Physics Letters, vol. 85, No. 16, p.3543, 2004, for example). Therefore, in a case where $LaAlO_3$ is used as the interelectrode insulating film, the film thickness of the interelectrode insulating film becomes larger. When heat treatment is carried out at 950° C. for 30 seconds, for example, 100 nm of Al is diffused. The influence of such diffusion is significant in miniaturization of the floating gate electrodes of future nonvolatile semiconductor memory devices. Also, the interface between the floating gate electrode and the blocking layer (the interelectrode insulating film) becomes unclear due to such mutual diffusion, and the pressure resistance of the device is lowered. As a result, the device characteristics such as write, erase, and charge retention characteristics of the nonvolatile semiconductor memory device might be degraded.

Further, as nonvolatile semiconductor memory devices have become smaller, the use of a metal gate as the control gate electrode is being considered in recent years, so as to reduce parasitic resistance and restrain electrode depletion. Also, the use of a FUSI (Fully Silicided) gate is being considered, as a FUSI gate has high compatibility with the current manufacturing process. However, being a silicide, a FUSI electrode contains Si therein, and might cause mutual diffusion between the floating gate electrode and the FUSI electrode. In a field effect transistor having metal/insulator/semiconductor junctions (a MISFET), on the other hand, the use of a high-permittivity insulating film as the gate insulating film is being considered, so as to secure a sufficient gate capacity without a reduction in physical thickness of the insulating film. When the high-permittivity film is formed or when heat treatment is carried out after the film formation, the interface is oxidized by the oxygen desorbed from the high-permittivity insulating film, and also causes interface states or fixed charges at the same time.

To counter this problem, the interfacial characteristics are improved by inserting a thin silicon oxide film in the interface between a silicon substrate and a high-permittivity gate insulating film. However, the insertion of a silicon oxide film with low permittivity makes the film thinning difficult.

Also, there have been reports of the problem that a high-permittivity material crystallizes during high-temperature heat treatment and degrades the characteristics of the insulating film. To counter this problem, nitrogen introduction into such a high-permittivity material has been suggested to restrain the crystallization. However, nitrogen existing in the interface between a high-permittivity insulating film and a silicon substrate greatly degrades the interfacial characteristics. Particularly, in a case where a p-MOSFET is in an ON state, the threshold value shifts in the negative direction, and the driving current becomes lower (NBTI (Negative Bias Temperature Instability)). This is undesirable in view of long-term reliability. In a case where a $LaAlO_3$ layer as a high-permittivity material is formed on a Si substrate, mutual diffusion is caused between the Si substrate and the $LaAlO_3$ layer when heat treatment is carried out at 950° C. for 30 seconds (see FIG. 2 in "Outdiffusion of La and Al from amorphous $LaAlO_3$ in direct contact with Si(001)" by P. Sivasubramani et al., Applied Physics Letters 86, 201901 (2005), for example). Due to the mutual diffusion, a silicate with low permittivity is formed between the $LaAlO_3$ layer and the Si substrate.

It is known that, if heat treatment is carried out at 1000 ° C. for 60 seconds in a structure having a $LaAlO_3$ layer and a polycrystalline Si layer stacked on a Si substrate, a reaction is caused in the interface between the polycrystalline Si layer and the $LaAlO_3$ layer earlier than in the interface between the Si substrate and the $LaAlO_3$ layer (see FIG. 1 in "Field-effect transistors with $LaAlO_3$ and $LaAlO_xN_y$ gate dielectrics deposited by laser molecular-beam epitaxy" by X. B. Lu et al., Applied Physics Letters, vol. 85, No. 16, p.3543, 2004, for example).

As described above, with a stack structure formed with a polycrystalline silicon layer or a silicon substrate and a high-permittivity layer, there is the problem of mutual diffusion caused between the polycrystalline silicon layer or the silicon substrate and the high-permittivity layer.

SUMMARY OF THE INVENTION

The present invention has been made in view of these circumstances, and an object thereof is to provide a semiconductor device that has a stack structure formed with a silicon layer or a silicon substrate and a high-permittivity layer, and can restrain mutual diffusion between the silicon layer or the silicon substrate and the high-permittivity layer. Another object of the present invention is to provide a method for manufacturing such a semiconductor device.

A semiconductor device according to a first aspect of the present invention includes: a semiconductor substrate; a source region and a drain region formed at a distance from each other in the semiconductor substrate; a first insulating film formed on a portion of the semiconductor substrate, the portion being located between the source region and the drain region; a charge storage film formed on the first insulating film; a second insulating film formed above the charge storage film and made of a high-permittivity material; a control gate electrode formed above the second insulating film; and a silicon nitride layer including nitrogen atoms having three-coordinate nitrogen bonds, at least one of second-nearest neighbor atoms of the nitrogen atoms being a nitrogen atom, at least one of the charge storage film and the control gate electrode containing silicon, the silicon nitride layer being located between the second insulating film and the at least one of the charge storage film and the control gate electrode.

A semiconductor device according to a second aspect of the present invention includes: a substrate; a plate-like semiconductor element region formed on the substrate; a source region and a drain region formed in the plate-like semiconductor element region, and located at a distance from each other in the longitudinal direction of the plate-like semiconductor element region; a first insulating film formed on a portion of the semiconductor element region, the portion being located between the source region and the drain region; a charge storage film formed on the first insulating film; a second insulating film formed above the charge storage film and made of a high-permittivity material; a control gate electrode formed above the second insulating film; and a silicon nitride layer including nitrogen atoms having three-coordinate nitrogen bonds, at least one of second-nearest neighbor atoms of the nitrogen atoms being a nitrogen atom, at least one of the charge storage film and the control gate electrode containing silicon, the silicon nitride layer being located between the second insulating film and the at least one of the charge storage film and the control gate electrode.

A method for manufacturing a semiconductor device according to a third aspect of the present invention includes: forming a first insulating film on a semiconductor substrate; forming a charge storage film on the first insulating film; forming a second insulating film made of a high-permittivity film above the charge storage film; forming a control gate electrode above the second insulating film; forming a silicon nitride layer on at least one of the charge storage film and the second insulating film, the silicon nitride layer including nitrogen atoms having three-coordinate nitrogen bonds, at least one of second-nearest neighbor atoms of the nitrogen atoms being a nitrogen atom.

A method for manufacturing a semiconductor device according to a fourth aspect of the present invention includes: forming a plate-like semiconductor element region on a substrate; forming a first insulating film so as to cover side faces and a top face of a portion of the semiconductor element region, the first insulating film being located in a direction perpendicular to the direction in which the semiconductor element region extends; forming a charge storage film on the first insulating film; forming a second insulating film made of a high-permittivity material above the charge storage film; forming a control gate electrode above the second insulating film; forming a silicon nitride layer on at least one of the charge storage film and the second insulating film, the silicon nitride layer including nitrogen atoms having three-coordinate nitrogen bonds, at least one of second-nearest neighbor atoms of the nitrogen atoms being a nitrogen atom.

A method for manufacturing a semiconductor device according to a fifth aspect of the present invention includes: forming a silicon nitride layer on a silicon substrate by nitriding the silicon substrate with the use of a nitriding gas diluted with a dilution gas that does not react with the silicon substrate, the silicon nitride layer including nitrogen atoms having three-coordinate nitrogen bonds, at least one of second-nearest neighbor atoms of the nitrogen atoms being a nitrogen atom; forming a high-permittivity insulating film on the silicon nitride layer; and forming a gate electrode on the high-permittivity insulating film.

BRIEF DESCRIPTION OF THE DRAWINGS

FIG. 6 is a cross-sectional view illustrating the necessity of the in-plane continuousness in the silicon nitride layer 5a;

DETAILED DESCRIPTION OF THE INVENTION

Figure 1:
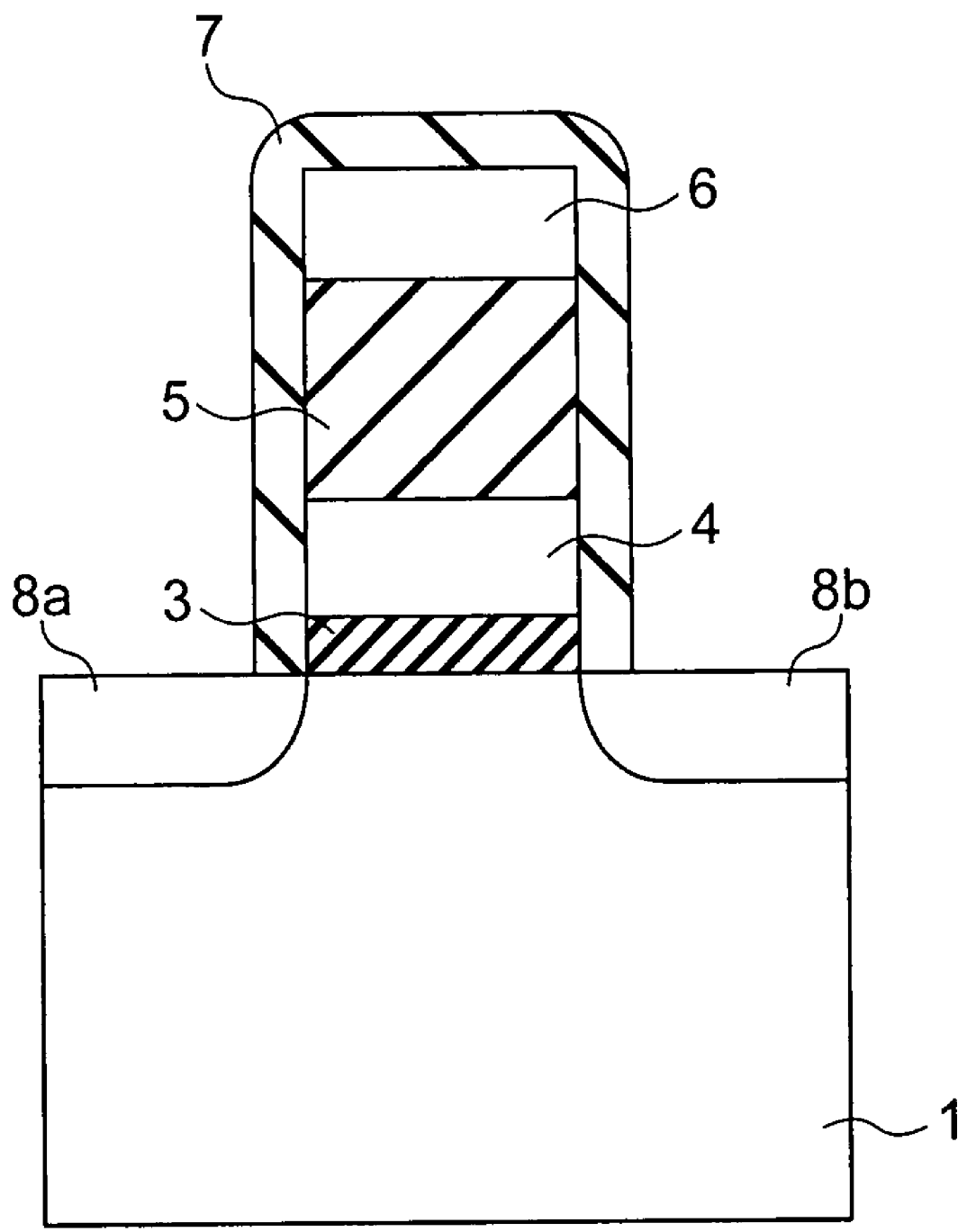
FIG. 1 is a cross-sectional view of a memory cell of a nonvolatile semiconductor memory device in accordance with a first embodiment.

The following is a description of embodiments of the present invention, with reference to the accompanying drawings. In the embodiments described below, like components are denoted by reference numerals, and explanation of those components is not repeated. Each of the accompanying drawings is a schematic view for ease of explanation and understanding of the present invention. The shapes, sizes, and scales may be different from those of actual devices, but they can be arbitrarily modified, with the following description and the conventional arts being taken into consideration.

First Embodiment

Referring now to FIG. 1, a semiconductor device in accordance with a first embodiment of the present invention is described. The semiconductor device of this embodiment is a floating-gate nonvolatile semiconductor memory device, and includes at least one memory cell shown in FIG. 1. The memory cell has a source region 8a and a drain region 8b formed at a distance from each other on the principal plane of a p-type silicon substrate 1. A gate electrode unit formed with stacked films of a tunnel insulating film 3, a floating gate electrode 4, an interelectrode insulating film 5, and a control gate electrode 6 is formed on the portion of the silicon substrate 1 located between the source region 8a and the drain region 8b. An insulating film 7 made of silicon oxide or the like is formed on the side faces and the top face of the gate electrode unit. The tunnel insulating film 3 is formed with a silicon oxynitride film or the like, and the floating gate electrode 4 and the control gate electrode 6 are formed with polycrystalline silicon films. The source region 8a and the drain region 8b are formed by implanting phosphorus ions, with the gate electrode unit serving as a mask. In the floating-gate nonvolatile semiconductor memory device, the floating gate electrode 4 functions as a charge storage film in which charges are accumulated.

The nonvolatile semiconductor memory device of this embodiment is characterized by the structure of the interelectrode insulating film 5. The interelectrode insulating film 5 of this embodiment is a three-layer structure having a $LaAlO_x$ layer 5b interposed between silicon nitride layers 5a and 5c including three-coordinate nitrogen bonds and at least one nitrogen atom among the second-nearest neighbor atoms of the nitrogen.

Here, the silicon nitride layers 5a and 5c are formed by depositing an amorphous silicon layer or the like on each of the floating gate electrode 4 and the $LaAlO_x$ film 5b, and nitriding the amorphous silicon layer.

However, if each of the amorphous silicon layer is nitrided by a conventional technique (for example, by performing thermal nitridation or plasma nitridation under regular conditions) to form silicon nitride layers, or a silicon nitride layer is formed on the floating gate electrode 4 by CVD (Chemical Vapor Deposition) method, an incomplete nitrogen bonding state such as a two-coordinate nitrogen bond is formed, and the silicon nitride layers 5a and 5c of this embodiment having three-coordinate nitrogen bonds and at least one nitrogen atom among the second-nearest neighbor atoms of the nitrogen cannot be obtained. In the above described two-coordinate nitrogen bond, one bonding hand of nitrogen is doubly-bonded to silicon, and there is not a non-bonded hand. However, such a bond is unsteady, and can be easily cut off.

As described above, the probability of the mutual diffusion in the interface between the electrode containing LaAlO, and Si and the insulating film or the semiconductor substrate is affected by the Si bonding state (see FIG. 1 in "Outdiffusion of La and Al from amorphous $LaAlO_3$ in direct contact with Si(001)" by R Sivasubramani et al., Applied Physics Letters 86, 201901 (2005), for example). In view of this, it is considered that the reaction can be restrained by a stronger bonding state. Therefore, in a case where an incomplete silicon nitride film is formed with Si—N bonds, the effect of restraining mutual diffusion cannot be achieved.

The inventors have already found that a nitriding gas is diluted with a dilution gas that is not actually reactive, and nitridation is effectively performed where the total pressure of the gas is lowered, so as to restrain two-coordinate nitrogen bonding and to form the silicon nitride films 5a and 5c having the above described characteristics. The inventors have already filed a patent application concerning this technique (Japanese Patent Application No. 2006-176863).

Figure 3:
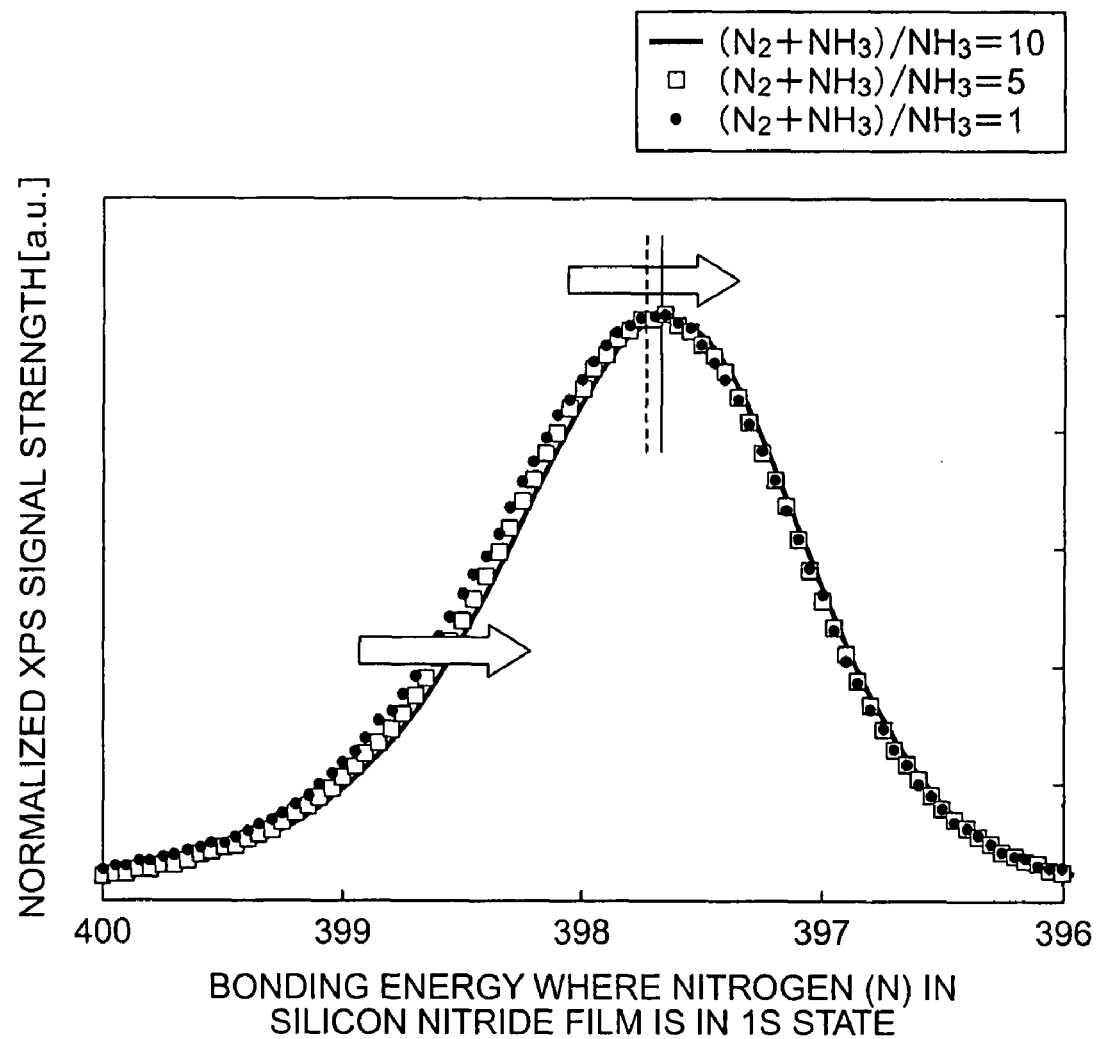
FIG. 3 shows the nitrogen spectra of a silicon nitride film having a three-coordinate nitrogen bonding state and a silicon nitride film having a conventional structure by photoelectron spectroscopy.

FIG. 3 shows the results of measurement carried out by XPS (X-ray Photoelectron Spectroscopy) to measure the variation of the nitrogen (N) bonding state in a silicon nitrogen film by diluting a nitriding gas $NH_3$ with a $N_2$ gas that is not actually reactive in a case where a silicon substrate is nitrided with the use of the nitriding gas $NH_3$. In FIG. 3, the abscissa axis indicates the bonding energy observed where the nitrogen (N) in the silicon nitride film is in the 1s state, and the ordinate axis indicates the number of nitrogen atoms retaining the bonding energy per unit volume. In FIG. 3, the number of nitrogen atoms where the bonding energy is 397.75 eV with which the number of nitrogen atoms should be the largest is normalized to be a constant value, regardless of the ratio between the partial pressure of the nitriding gas $NH_3$ and the sum of the partial pressure of the nitriding gas $NH_3$ and the partial pressure of the dilution gas $N_2$ $(=(NH_3 + N_2)/NH_3)$. As can be seen from FIG. 3, the number of nitrogen atoms having bonding energy lower than 397.75 eV, with which the number of nitrogen atoms should be the largest, does not substantially vary even if the dilution ratio of the dilution gas $N_2$ is varied from 1 to 5 to 10. However, as the dilution ratio of the dilution gas $N_2$ is increased from 1 to 5 to 10, the number of nitrogen atoms having the bonding energy in the range of 398 eV to 399 eV decreases. In other words, as the dilution ratio of $N_2$ is increased from 1 to 5 to 10, the energy of the nitrogen in the Is state in the silicon nitride film is restrained to 397.75 eV. The nitrogen atoms having the bonding energy in the range of 398 eV to 399 eV are in the two-coordinate bonding state or a metastable, quasi three-coordinate state, and the nitrogen atoms having the bonding energy of 397.75 eV are in a more stable three-coordinate bonding state.

Judging from the experiment results shown in FIG. 3, it can be seen that, as the dilution ratio of $N_2$ becomes higher, the number of nitrogen atoms in a more stable three-coordinate bonding state becomes larger, and a silicon nitride film having a stable bonding state can be formed. As disclosed in the patent application (Japanese Patent Application No. 2006-176863) filed by the inventors, it is more preferable to set the dilution ratio at 5 or higher. In view of the controllability of the current manufacturing devices, the upper limit of the dilution ratio is 10000 times or less, preferably, 100 times or less, and more preferably, 10 times or less. A high-quality nitride film can be formed with a total pressure of 40 Torr or lower, and it is preferable to restrain the total pressure to a lower value. However, the lower limit of the total pressure should be equal to or higher than the pressure limitation of the device in the heating procedure. Preferably, the total pressure is 1 Torr or higher, and more preferably, 3 Torr or higher.

Figure 4:
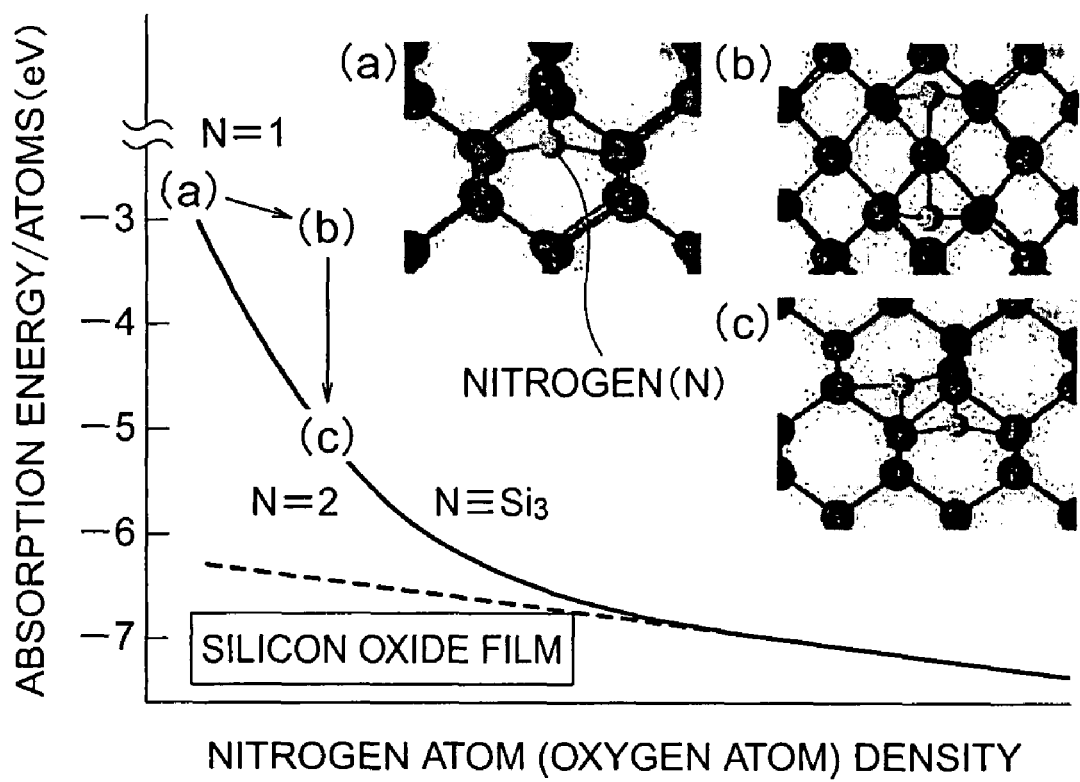
FIG. 4 shows the relationship between the nitrogen density and the bonding force between silicon and nitrogen.

FIG. 4 shows the results of the first principle calculation as to the nitrogen bonding state and its stability. The abscissa axis indicates the density per unit volume. The number of second-nearest neighbor nitrogen atoms becomes larger, and the structure becomes closer to a $Si_3N_4$ structure, as it becomes closer to the right on the abscissa axis. The ordinate axis indicates the absorption energy per one nitrogen (or oxygen) atom. The absorption energy is equivalent to the bonding strength, and the bonding indicated at a lower point on the ordinate axis is stronger and more stable. In FIG. 4, (a), (b), and (c) represent the states and density of the three-coordinate bonds of silicon and nitrogen. More specifically, (a) represents the state in which one three-coordinate nitrogen atom exists between lattices, (b) represents the state in which two three-coordinate nitrogen atoms exist between lattices, and there are no nitrogen atoms second-nearest neighboring the three-coordinate nitrogen atoms, and (c) represents the state in which two three-coordinate nitrogen atoms exist between lattices, and there are nitrogen atoms second-nearest neighboring the three-coordinate nitrogen atoms. As can be seen from FIG. 4, a three-coordinate state of nitrogen (N≡Si3) is a state in which there are second-nearest neighboring nitrogen atoms, or bonds as strong as the silicon-oxygen bonds in a silicon oxide film can be formed by increasing the density.

Figure 5:
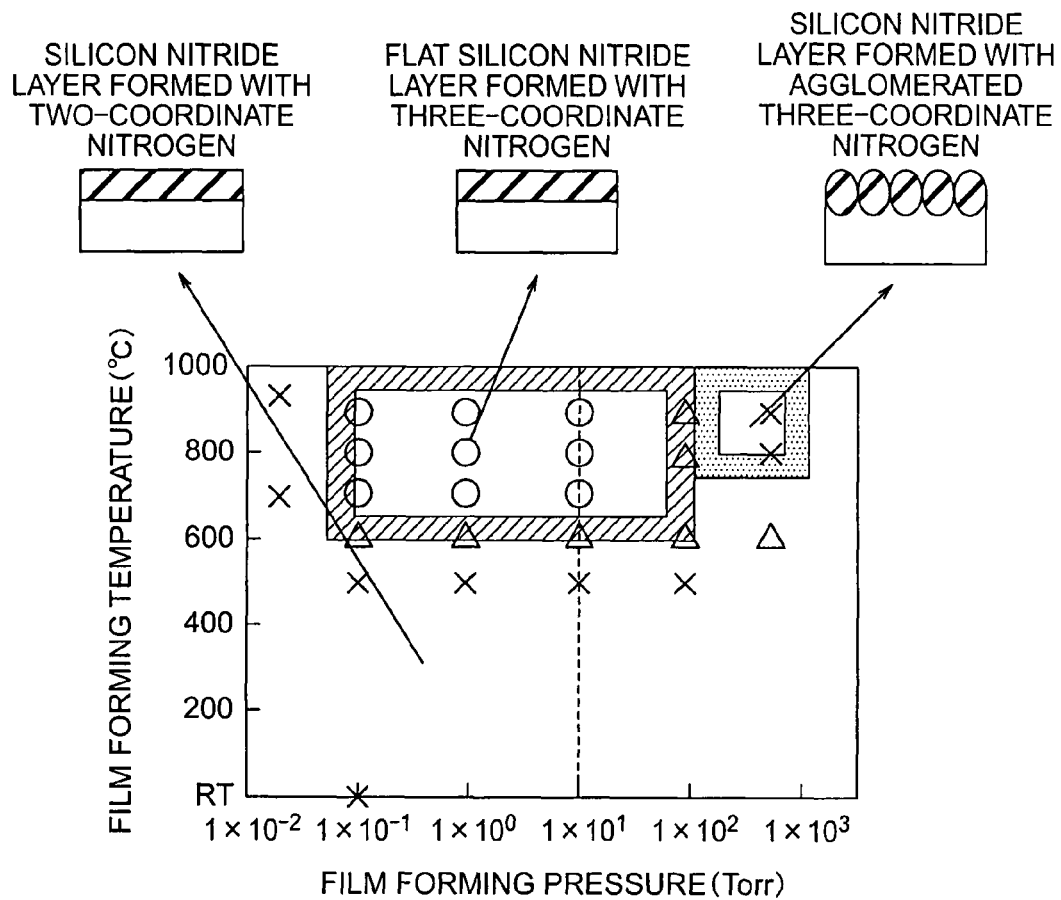
FIG. 5 shows the relationship between the nitriding temperature and the film forming pressure when a silicon nitride layer is formed.
Figure 6:
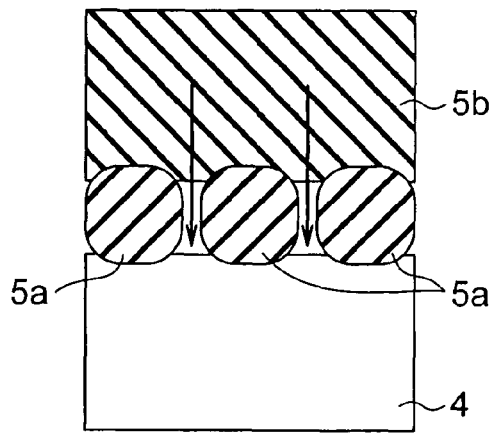

FIG. 5 shows the relationship between the nitriding temperature and the film forming pressure, with respect to the film quality and flatness of a silicon nitride layer obtained by nitriding an amorphous silicon layer. As shown in FIG. 5, the film quality and flatness of a silicon nitride layer can be controlled by adjusting the nitriding temperature and the film forming pressure. As can be seen from FIG. 5, a flat silicon nitride layer can be obtained at 600° C. or lower. However, the density of three-coordinate nitrogen bonds is low, and there are incomplete bonds such as two-coordinate nitrogen. Therefore, mutual diffusion in the interface cannot be restrained. If nitridation is performed with a pressure of 100 Torr or higher and at a temperature of 800° C. or higher, a silicon nitride layer with high-density three-coordinate nitrogen bonds can be formed. However, agglomeration is caused in the course of growing a silicon nitride layer, resulting in a granular layer with poorer flatness. In a silicon nitride layer having poorer flatness due to agglomeration, La and Al enter narrow spaces of the silicon nitride layer 5a, as indicated by the arrows in FIG. 6, and desired effects cannot be achieved.

Further, it is preferable to perform nitridation at a lower temperature than the temperature at which amorphous silicon is crystallized. More specifically, it is preferable to perform nitridation at 700° C. or lower. This is because the roughness is increased by crystallization, though nitridation can be performed after crystallization. Particularly, in high vacuum, a silicon layer is agglomerated and turned into grains prior to nitridation, for example. Therefore, to maintain the flatness and nitriding efficiency of the amorphous silicon, and to obtain a high-quality interelectrode insulating film with high reliability, it is preferable to perform nitridation at a lower temperature than the temperature at which a silicon layer is crystallized.

Accordingly, it is preferable to nitride an amorphous silicon layer with a nitriding pressure of 0.1 Torr to 40 Torr at a nitriding temperature of 600° C. to 1000° C., more preferably, 600° C. to 700° C.

As described above, the nitrogen bonds in the silicon nitride layers 5a and 5c of this embodiment are stable, and cannot be easily cut off even when heat treatment is carried out at a high temperature. In this embodiment, interfacial reactions in the interface between the interelectrode insulating film and the floating gate electrode and the interface between the interelectrode insulating film and the control gate electrode can be prevented when heat treatment is carried out at a high temperature.

As described above, in the nonvolatile semiconductor memory device of this embodiment, the LaAlOx layer 5b is interposed between the silicon nitride layers 5a and 5c that are characterized by having three-coordinate nitrogen bonds and at least one nitrogen atom among the second-nearest neighbor atoms of the nitrogen. With the there-layer structure, mutual diffusion in the interface between the interelectrode insulating film 5 and the polycrystalline Si film as the floating gate electrode 4 and in the interface between the interelectrode insulating film 5 and the polycrystalline Si film as the control gate electrode 6 can be restrained when heat treatment is carried out at a high temperature. Thus, the heat resistance of the interelectrode insulating film can be made higher.

Also, in accordance with this embodiment, it is possible to use $LaAlO_x$, which is a high-permittivity material, as the interelectrode insulating film between the floating gate electrode 4 and the control gate electrode 6. Accordingly, the coupling ratio between the floating gate electrode 4 and the control gate electrode 6 can be made higher. Thus, each memory cell can be made smaller, and the device characteristics such as write, erase, charge retention characteristics of each memory cell (device) and the reliability can be improved as the interfacial characteristics are improved.

Furthermore, to increase the coupling ratio, there is no need to increase the area of the interelectrode insulating film 5 between the floating gate electrode 4 and the control gate electrode 6. Accordingly, the area of the interelectrode insulating film 5 can be made equal to the area of the tunnel insulating film 3, and the gate electrode unit can be a simple, flat stack structure. Thus, the interference between the cells due to miniaturization of the device can be reduced.

Referring now to FIGS. 7A through 9C, a method for manufacturing the floating-gate nonvolatile semiconductor memory device of this embodiment is described. FIGS. 7A through 9C are cross-sectional views illustrating the procedures for manufacturing the floating-gate nonvolatile semiconductor memory device of this embodiment.

Figure 7A:
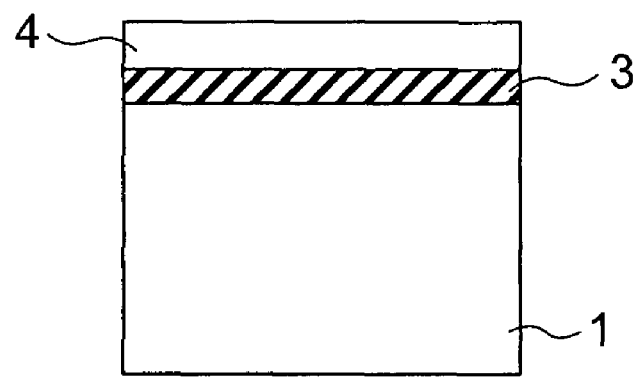
FIGS. 7A through 7C are cross-sectional views illustrating the procedures for manufacturing the nonvolatile semiconductor memory device in accordance with the first embodiment.

First, as shown in FIG. 7A, a p-type silicon substrate 1 having a plane orientation (100) and specific resistance of 10 Ωcm to 20 Ωcm is prepared. A silicon oxynitride film as the tunnel insulating film 3 and a polycrystalline silicon film as the floating gate electrode 4 are deposited in this order on the silicon substrate 1.

Figure 7B:
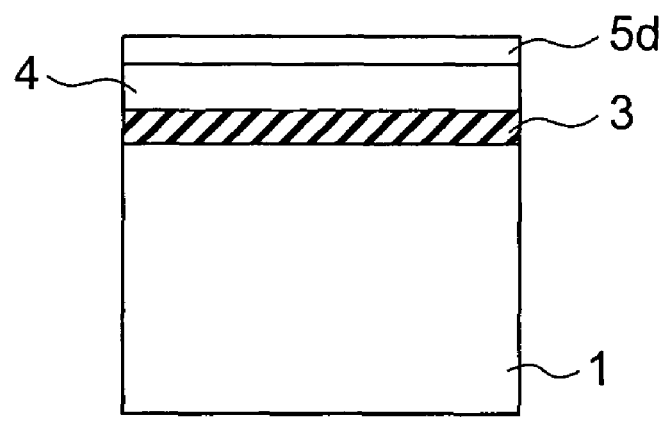

As shown in FIG. 7B, a flat amorphous silicon layer 5d of approximately 0.5 nm in thickness is formed on the floating gate electrode 4, using a disilane gas, for example. A procedure for increasing the surface dangling bonds may be carried out immediately before the amorphous silicon is deposited. By increasing the number of dangling bonds on the surface on which the amorphous silicon is to be deposited, an insulating film with excellent flatness and insulation properties can be formed. In the procedure for increasing the dangling bonds, 5-second plasma nitridation with 100 W of power may be performed on the surface of the film to be deposited in a He atmosphere that is 40% diluted with a $N_2$ gas with the pressure of 0.08 Torr, for example.

Figure 7C:
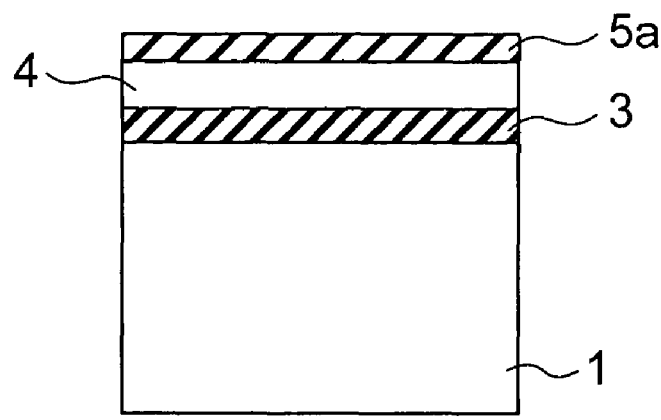

As shown in FIG. 7C, the amorphous silicon layer 5d is directly nitrided through plasma nitridation with the pressure of 40 Torr (5320 Pa) and at the temperature of 700° C., with the use of a nitriding gas that is diluted fivefold with Ar. In this manner, the silicon nitride layer 5a of approximately 1 nm in thickness is formed.

Figure 8A:
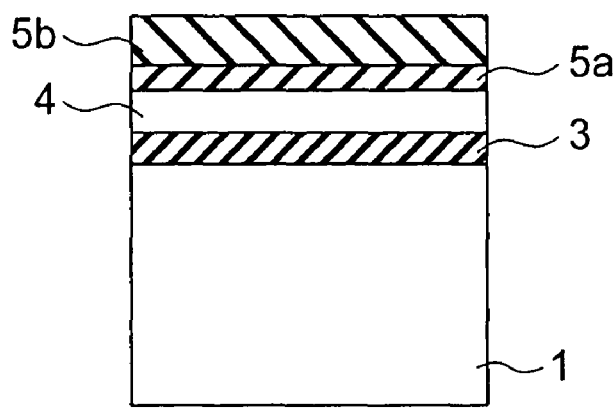
FIGS. 8A through 8C are cross-sectional views illustrating the procedures for manufacturing the nonvolatile semiconductor memory device in accordance with the first embodiment.

As shown in FIG. 8A, the $LaAlO_x$ layer 5b of 15 nm in thickness, for example, is formed on the silicon nitride layer 5a by CVD method.

Figure 8B:
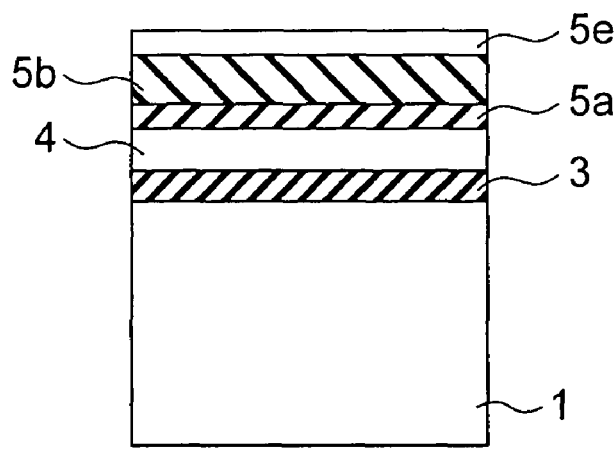

As shown in FIG. 8B, a flat amorphous silicon layer 5e of approximately 0.5 nm in thickness is formed on the $LaAlO_x$ layer 5b, using a disilane gas, for example. As in the procedure for depositing the amorphous silicon layer 5d, a procedure for increasing the surface dangling bonds may be carried out immediately before the amorphous silicon is deposited.

Figure 8C:
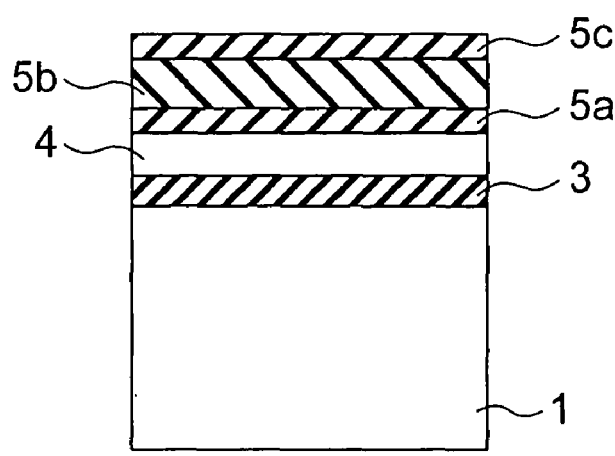

As shown in FIG. 8C, the amorphous silicon layer 5e is directly nitrided through plasma nitridation with 40 Torr (5320 pa) and at 700° C., with the use of a nitriding gas that is diluted fivefold with Ar. In this manner, the silicon nitride layer 5c of approximately 1 nm in thickness is formed.

Figure 9A:
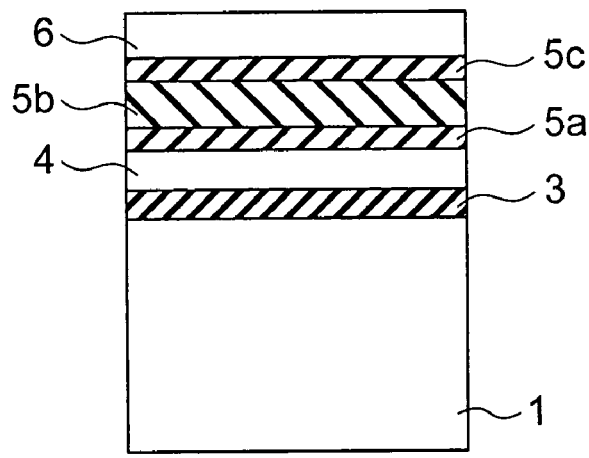
FIGS. 9A through 9C are cross-sectional views illustrating the procedures for manufacturing the nonvolatile semiconductor memory device in accordance with the first embodiment.

As shown in FIG. 9A, an n-type polycrystalline silicon film that is 200 nm in thickness and has phosphorus added thereto is deposited as the control gate electrode 6 on the silicon nitride layer 5c.

Figure 9B:
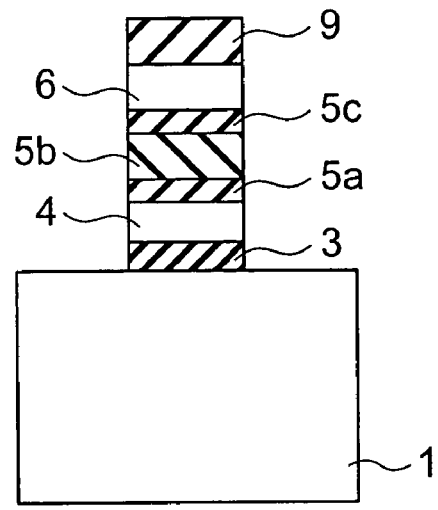

As shown in FIG. 9B, after a resist mask 9 of photoresist is formed on the control gate electrode 6 by a lithography technique, reactive ion etching with the use of the resist mask 9 is performed on the polycrystalline silicon film as the control gate electrode 6, the silicon nitride layer 5c, the $LaAlO_x$ layer 5b, the silicon nitride layer 5a, the polycrystalline silicon film as the floating gate electrode 4, and the tunnel insulating film 3. In this manner, the gate electrode unit is formed. After the resist mask 9 is removed, heat treatment is carried out in an oxygen atmosphere for the purpose of recovery from processing damage or the like, and an oxide film 7 of approximately 3 nm is formed (see FIG. 9C).

Figure 9C:
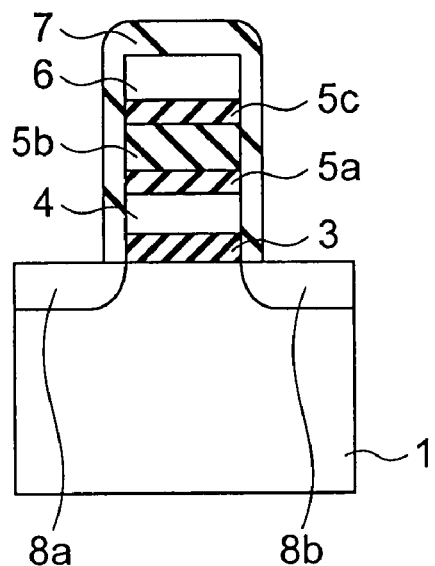

With the gate electrode unit serving as a mask, phosphorus ions are implanted at $3 \times 10^{15}$ cm$^{-2}$ into the entire surface. Heat treatment is then carried out at 1000° C. for 20 seconds, so as to diffuse and activate the phosphorus ions in the silicon substrate 1. In this manner, the source region 8a and the drain region 8b are formed, and the structure shown in FIG. 9C is obtained.

Although not specifically shown in the drawings, an interlayer insulating film is then deposited by CVD method, and a contact hole is formed. An electrode is then formed with an aluminum film, followed by heat treatment in a nitrogen atmosphere.

In the above description, direct nitridation using nitrogen plasma has been described as an example of the technique for forming a silicon nitride layer having three-coordinate nitrogen bonds. However, the present invention is not limited to that technique, and the same effects as above can be achieved through nitridation using an ammonia ($NH_3$) gas or a nitrogen radical. When an ammonia gas is used, hydrogen is introduced into the silicon nitride layer. Therefore, after the silicon nitride layer is formed, heat treatment may be carried out in vacuum or in a nitrogen or inactive gas at a higher temperature than the silicon nitride layer forming temperature, so as to remove the hydrogen introduced into the film. This also applies to the other embodiments described later.

In this embodiment, each silicon nitride layer is formed by nitriding an amorphous silicon layer. However, the present invention is not limited to that technique. For example, it is possible to use a polycrystalline silicon layer, instead of an amorphous silicon layer. The silicon nitride layer 5a may be formed by performing direct nitridation on the polycrystalline silicon film as the floating gate electrode 4. However, to flatten the interelectrode insulating film, it is preferable to use an amorphous silicon thin film. Furthermore, to form a nitride layer structure in which nitrogen atoms and nitrogen compounds can be easily diffused and bonded in the film at the time of nitridation, it is more preferable to use an amorphous silicon thin film than to use a crystalline silicon layer. Using an amorphous silicon thin film, the nitridation efficiency is increased, and a high-quality nitride layer is realized.

To form silicon nitride layers having three-coordinate nitrogen bonds, the amorphous silicon layers 5d and 5e formed in the procedures shown in FIGS. 7B and 8B need to be continuous flat films. If nitridation is performed on discontinuous amorphous silicon layers 5d and 5e having silicon "islands (nuclei)" in a scattered state, thin spots and non-nitrided silicon atoms remain in the silicon layers, and it becomes difficult to form the silicon nitride layers 5a and 5c of this embodiment.

The film thickness of each of the silicon nitride layers 5a and 5c is preferably 0.4 nm to 1 nm. If the film thickness is 0.4 nm or more, stable properties as a film can be easily achieved. If the film thickness is 1 nm or less, a high-quality nitride layer can be formed at a higher speed. To avoid variations, the film thickness of the silicon nitride layer 5a should preferably be 0.7 nm or more.

Figure 10:
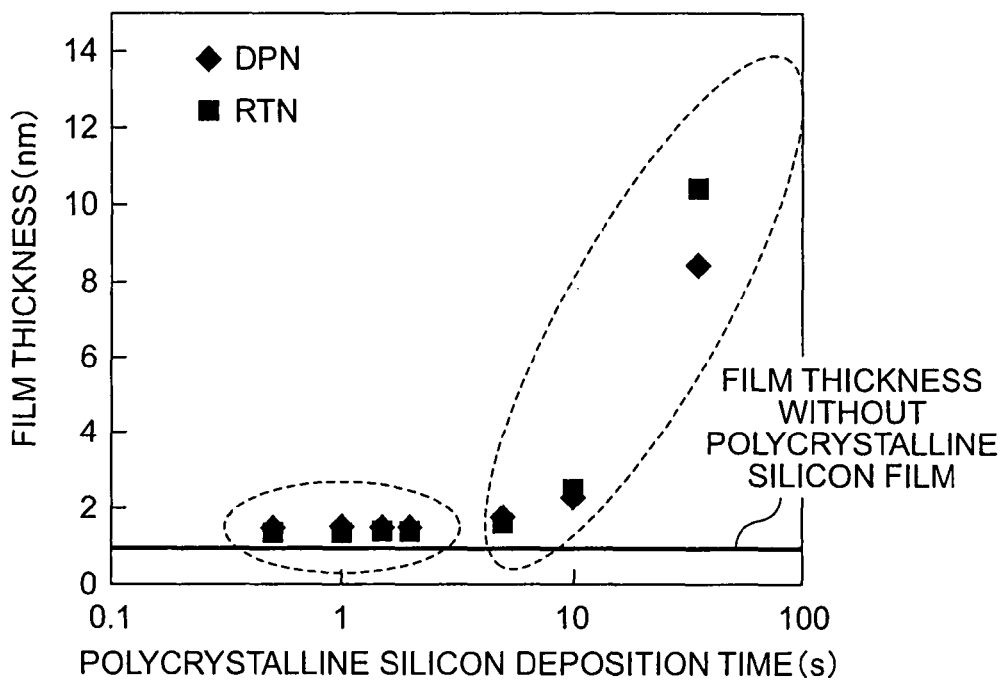
FIG. 10 shows the relationship between the time required for depositing a polycrystalline silicon film and the film thickness of the formed nitride film.

FIG. 10 shows the variations of the film thicknesses of nitride films that were formed where nitridation was performed at 700° C. for 1000 seconds after silicon films were deposited on a silicon substrate, with the deposition time being varied. At the point where the deposition time is 0.5 seconds, the film thickness starts increasing. At the point where the deposition time is 5 seconds, the film thickness starts increasing dramatically. This is because silicon is not deposited or a continuous film is not formed with the deposition time of 0.5 seconds or shorter. This is also because silicon is not formed into a continuous film and is in a single-crystal state (the same state as bare silicon), instead of a polycrystalline state), with the deposition time being in the range of 0.5 seconds to 5 seconds. During such a period, single-crystal silicon is nitrided at a low nitridation rate. Where the deposition time is 5 seconds, polycrystalline silicon is deposited on single-crystal silicon. As the nitridation rate of polycrystalline silicon is high, the film thickness starts increasing rapidly.

This phenomenon is also observed in a case where the base layer is a silicon oxide film or a silicon nitride film. Accordingly, by monitoring such a phenomenon, checking can be performed to determine whether silicon is turned into a continuous film, and whether polycrystalline silicon is deposited. In this case, silicon should be deposited for a period of time in the range of 0.5 seconds to 5 seconds.

The silicon deposition time may be long, as long as silicon is in a single crystal state. However, it is necessary to prolong the time required for nitridation accordingly. If the nitridation time is insufficient, silicon is not completely nitrided. As a result, a number of defects exist in the film, and desired effects cannot be achieved. When silicon is completely nitrided, the network between silicon and nitrogen is established, and the high-density three-coordinate nitrogen bonds can be formed. Thus, the silicon nitride layers $5a$ and $5c$ of this embodiment can be formed.

Figure 11:
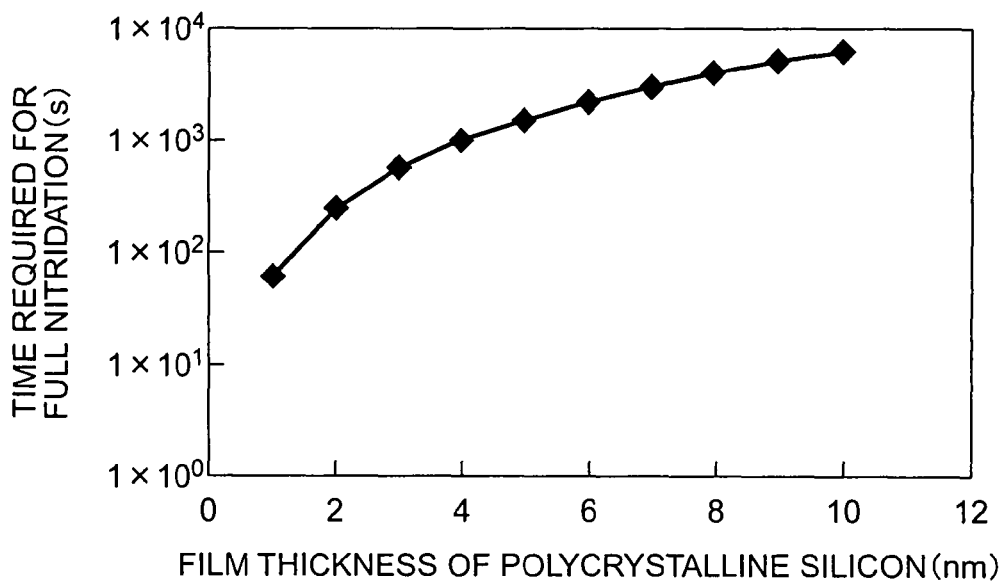
FIG. 11 shows the relationship between the time required for depositing a polycrystalline silicon film and the time in which nitridation is completed.

FIG. 11 shows the relationship between the film thickness of deposited silicon (single-crystal silicon+polycrystalline silicon) and the time required for complete nitridation. As the deposited film thickness becomes greater, the time required for nitridation becomes dramatically longer. This is because, when the nitrogen film becomes thick, the nitrogen needs to be diffused in the thick nitrogen film even if the silicon is in a polycrystalline state. Also, even after a polycrystalline silicon film is formed, it is critical to perform complete nitridation on the polycrystalline silicon film.

On the other hand, the silicon deposition time should not be too short. As for silicon deposition, the incubation time is a critical issue. More specifically, if the deposition time is shorter than the incubation time, silicon is not deposited, or silicon is not turned into a continuous film. Here, "turning into a continuous film" means that "the base for film deposition being not exposed".

Figure 12:
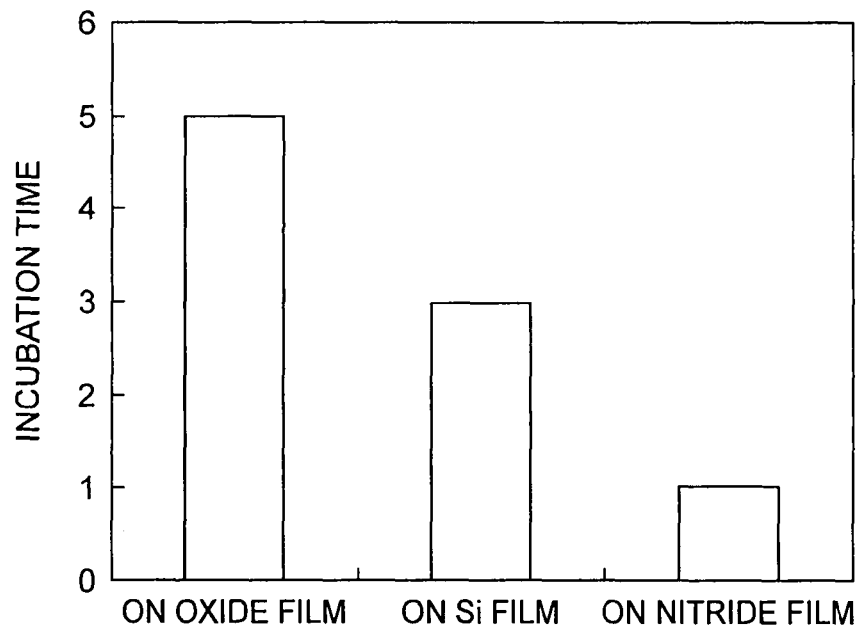
FIG. 12 shows a variation in incubation time of a polycrystalline silicon with different base layers.

FIG. 12 shows the incubation time of polycrystalline silicon deposited on a Si film, on a silicon oxide film made of $SiO_2$, and on a silicon nitride film made of $Si_3N_4$. The incubation time becomes shorter in order of the silicon deposited on the silicon oxide film, the silicon deposited on the Si film, and the silicon deposited on the silicon nitride film. The incubation time varies with the types of surfaces, because the number of dangling bonds existing on the surfaces varies.

The film thickness of a continuous silicon film varies with the number of dangling bonds existing on the surface on which the silicon is deposited. The time required for obtaining a continuous film is shorter in a case where a silicon film is formed on a silicon nitride film than in a case where a silicon film is formed on a Si film. This is because the number of dangling bonds existing on the surface of a nitride film is larger than the number of dangling bonds existing on the surface of a Si film. The time required for obtaining a continuous film is longer in a case where a silicon film is formed on a silicon oxide film than in a case where a silicon film is formed on a Si film. This is because the number of dangling bonds existing on the surface of a silicon oxide film is smaller than the number of dangling bonds existing on the surface of a Si film.

When the number of dangling bonds on the surface is small, the film is grown through a growth process called the "Volmer-Weber growth". In the Volmer-Weber growth process, atoms on the substrate are agglomerated to form nuclei. Flying atoms then gather one after another, and the nuclei three-dimensionally grow. At the same time as deposition, the nuclei ("islands") grow into a unit that is turned into a continuous film. The film is grown through this growth process in a case where the interaction among the deposited atoms is stronger than the interaction between the deposited atoms and the substrate atoms.

When the number of dangling bonds existing on the surface is large, a film grows through a growth process called the "Stranski-Krastanov growth". In the Stranski-Krastanov growth process, after a single layer (or layers) grows on a substrate, three-dimensional nuclei appear and grow on the single layer. If a large number of dangling bonds exists on the surface, a continuous film easily grows from the start. Accordingly, the time required for depositing polycrystalline silicon as a continuous film varies with the types of surfaces.

As can be seen from the relationship shown in FIG. 12, the time required for depositing the amorphous silicon layer $5d$ in the procedure shown in FIG. 7B is different from the time required for depositing the amorphous silicon layer $5e$ in the procedure shown in FIG. 8B. The time required for depositing a silicon film on a polycrystalline silicon film is approximately 0.5 seconds to 5 seconds, and the time required for depositing a silicon film on a silicon nitride film is approximately 0.5 seconds to 2 seconds. Also, the high-permittivity film such as a $LaAlO_3$ film has a lower atom density than a nitride film, and an oxide layer is expected on the surface. With those facts being taken into consideration, the time required for depositing an amorphous silicon layer on a silicon oxide film in this embodiment is 3 seconds to 7 seconds.

Figure 13:
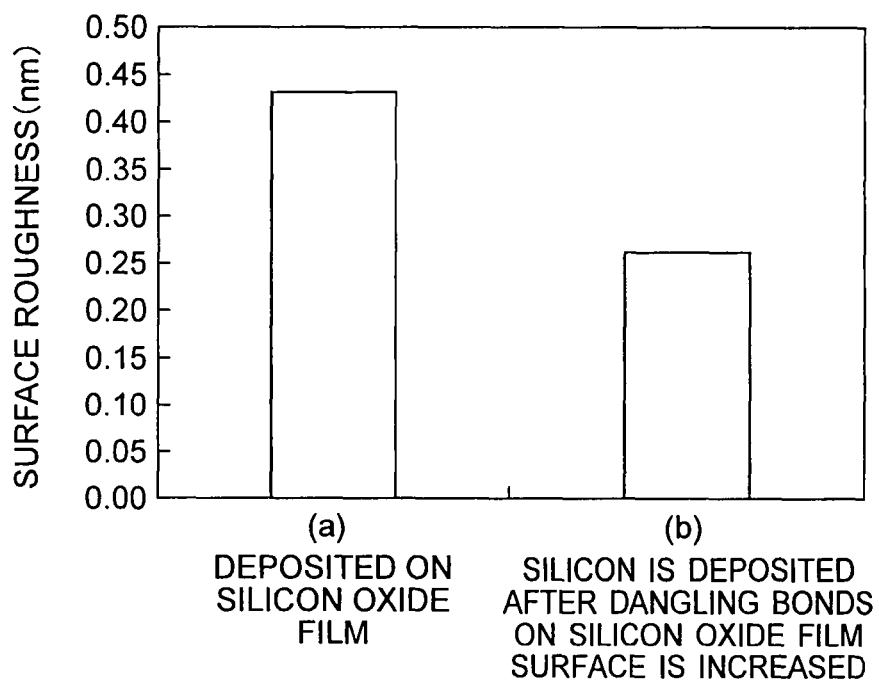
FIG. 13 shows variations in surface roughness observed in a case where silicon is deposited on a silicon oxide film and in a case where silicon is deposited after dangling bonds are formed on the surface of a silicon oxide film.

As described above, a flatter silicon film can be deposited by increasing the number of dangling bonds existing on the surface on which the silicon is deposited. FIG. 13 shows the variations of the surface roughness observed in a case (a) where silicon is deposited on a silicon oxide film and in a case (b) where silicon is deposited after 5-second plasma nitridation is performed on the surface of a silicon nitride film with 100 W of power in a He atmosphere 40% diluted with a $N_2$ gas with 0.08 Torr, or after dangling bonds are formed on the surface of the silicon oxide film. As the surface of the silicon nitride film is nitrided, the surface roughness of the deposited silicon becomes smaller. This is because the number of dangling bonds existing on the surface of the silicon oxide film increases with the nitridation, and the silicon growth process switches from the Volmer-Weber growth process to the Stranski-Krastanov growth process. Accordingly, by carrying out the procedure for increasing the number of surface dangling bonds immediately before silicon is deposited, an insulating film with more preferred flatness and insulation properties can be formed. The above described plasma nitridation is an example of the technique utilizing such a procedure.

In this embodiment, a $LaAlO_x$ (lanthanum aluminate) layer is used as an example of the high-permittivity layer $5b$ existing between the floating gate electrode 4 and the control gate electrode 6. However, the high-permittivity layer $5b$ is not limited to a $LaAlO_x$ layer, and may be any insulating layer containing metal and having higher permittivity than a silicon oxide. Such an insulating film may be formed with a high-permittivity metal oxide such as $Al_2O_3$ (aluminum oxide) or $HfO_2$ (hafnium oxide), an aluminate ($MAlO_x$: M representing a metal element, x representing the oxygen content), a silicate (MSiO$_x$: M representing a metal element, x representing the oxygen content), an oxide of a transition metal such as HfO$_2$, ZrO$_2$, or CeO$_2$, or La$_2$O$_3$ or LaSiO$_x$. With any of those materials, the same effects as above can be achieved.

Figure 14:
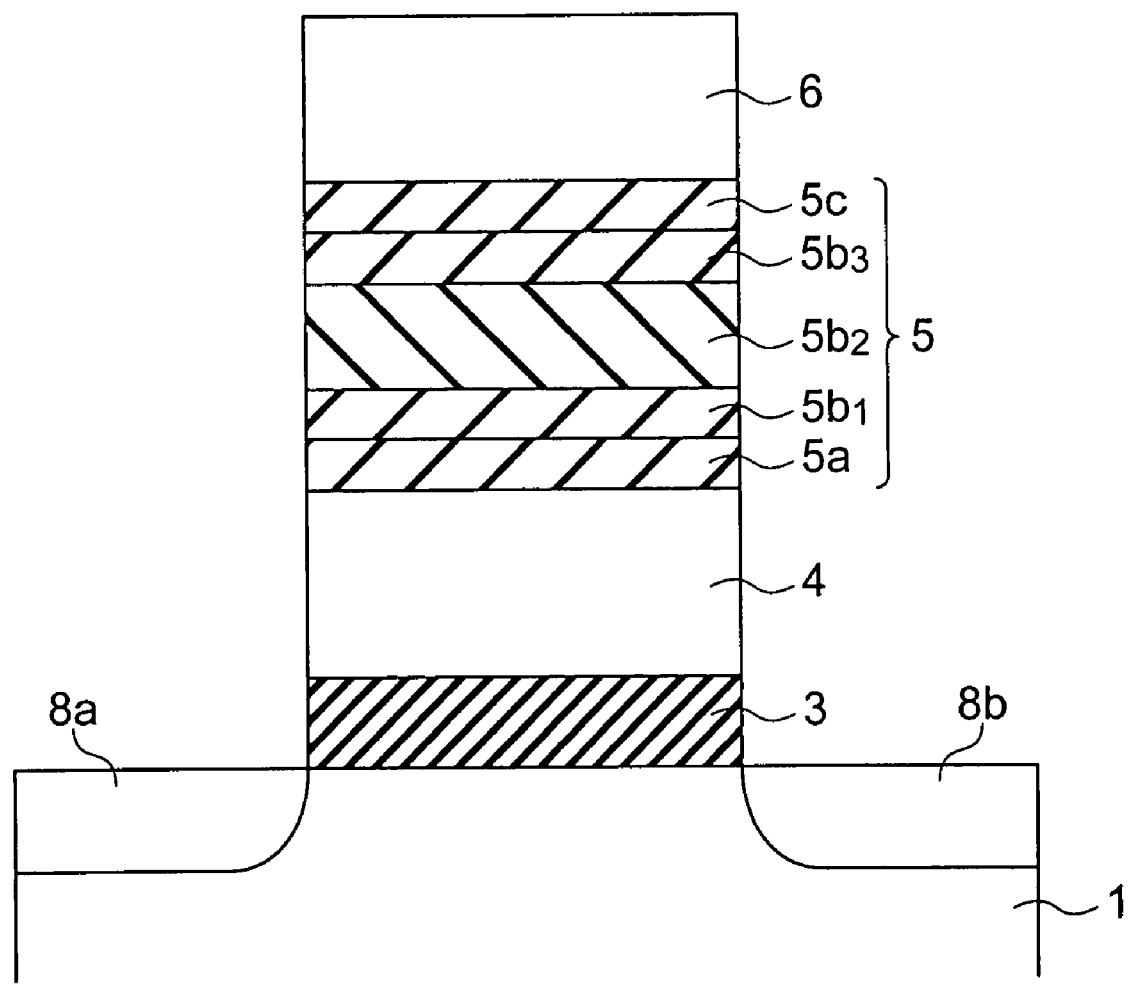
FIG. 14 is a cross-sectional view of a gate electrode in accordance with a first modification of the first embodiment.

As in a first modification of this embodiment shown in FIG. 14, the high-permittivity layer 5b may have a three-layer structure consisting of an Al$_2$O$_3$ layer 5b$_3$, a LaAlO$_x$ layer 5b$_2$, and an Al$_2$O$_3$ layer 5b$_1$. With this structure, the Si diffusion from the floating gate electrode 4 and the control gate electrode 6 is more strictly restrained, and higher heat resistance can be achieved. In a case where a high-permittivity layer containing La is used as the high-permittivity layer 5b$_2$ in the three-layer structure, high-permittivity layers containing aluminum or hafnium can be used as the high-permittivity layers 5b$_1$ and 5b$_3$.

Figure 15:
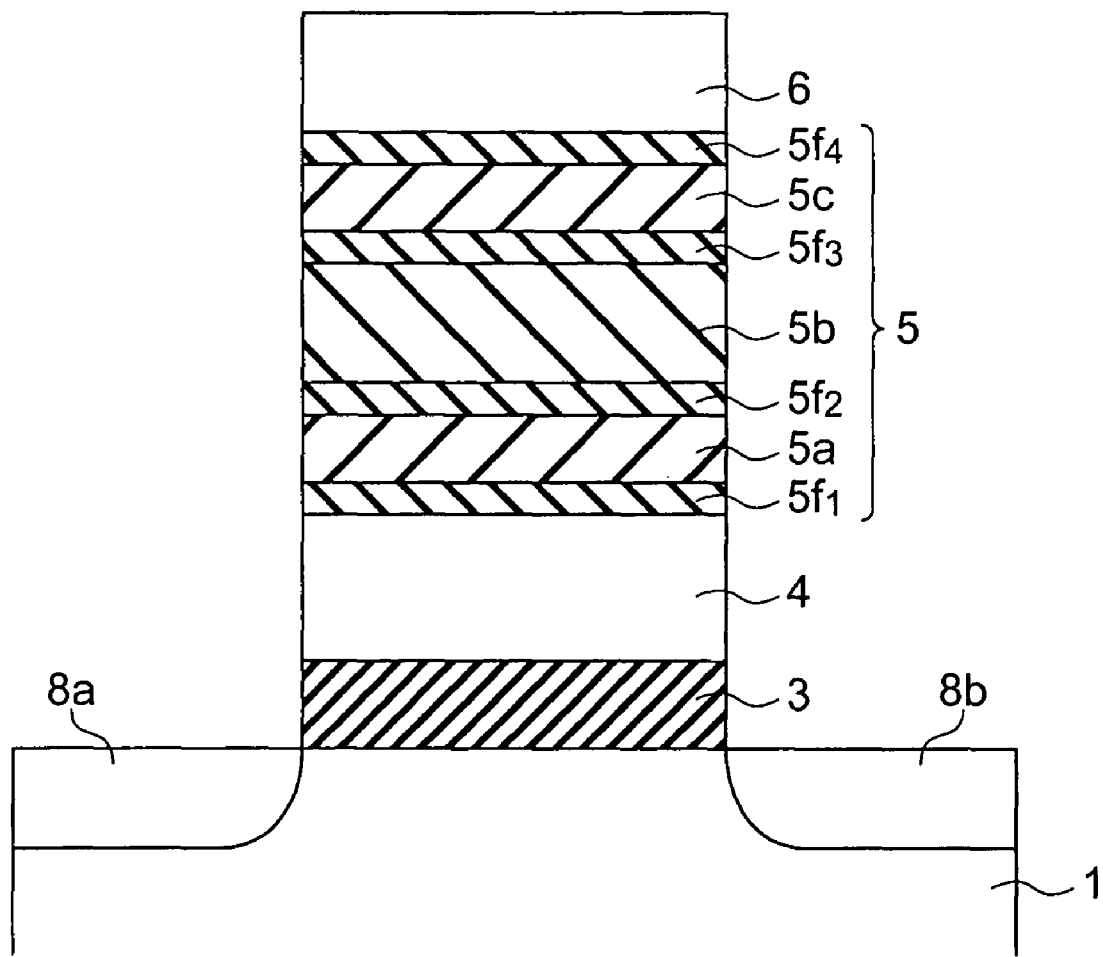
FIG. 15 is a cross-sectional view of a gate electrode in accordance with a second modification of the first embodiment.

The silicon nitride layers 5a and 5c may not be silicon nitride layers (SiN$_x$), as long as they are continuous in the in-plane direction described above, have three-coordinate nitrogen bonds, and have at least one nitrogen atom among the second-nearest neighbor atoms of the nitrogen. For example, the silicon nitride layers 5a and 5c may be silicon oxynitride layers (SiON). Alternatively, as in a second modification of this embodiment shown in FIG. 15, thin silicon oxide layers 5f$_1$ and 5f$_2$ (SiO$_2$) may be formed on both sides of the silicon nitride layer 5a, and thin silicon oxide layers 5f$_3$ and 5f$_4$ may be formed on both sides of the silicon nitride layer 5c. The silicon oxide layers 5f$_1$, 5f$_2$, 5f$_3$, and 5f$_4$ reinforce the barrier function of the interelectrode insulating film 5 (the function of preventing the carriers injected into the floating gate electrode 4 from flowing into the control gate electrode 6).

As described above, in accordance with this embodiment, mutual diffusion between an electrode (the floating gate electrode or the control gate electrode) containing silicon and the interelectrode insulating film can be prevented by virtue of high-quality silicon nitride layers provided in the interfaces of the interelectrode insulating film made of a high-permittivity material. Thus, degradation of device characteristics, such as write, erase, and charge retention characteristics, can be prevented.

Second Embodiment

Figure 16:
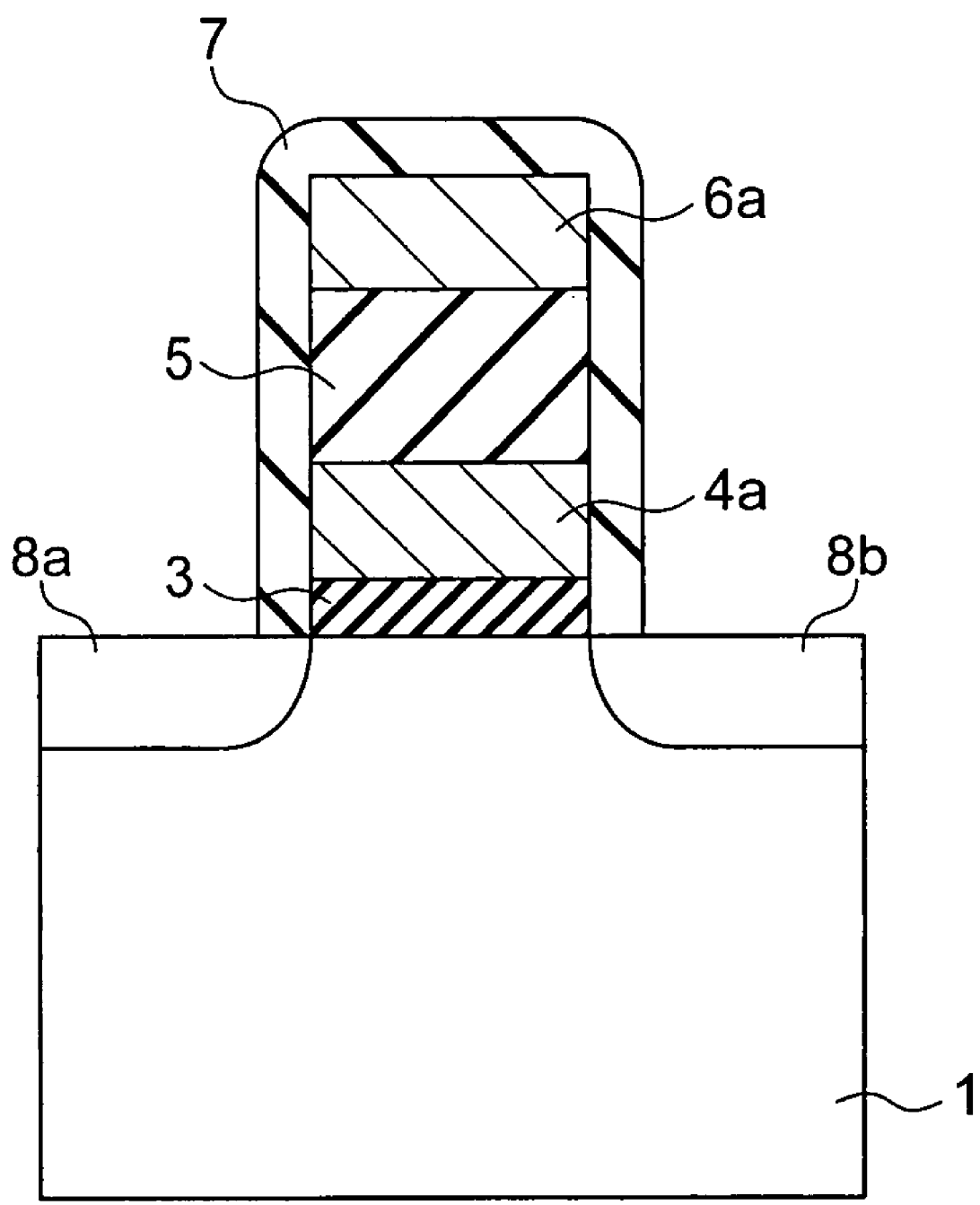
FIG. 16 is a cross-sectional view of a memory cell of a nonvolatile semiconductor memory device in accordance with a second embodiment.

Referring now to FIG. 16, a semiconductor device in accordance with a second embodiment of the present invention is described. The semiconductor device of this embodiment is a floating-gate nonvolatile semiconductor memory device, and contains at least one memory cell shown in FIG. 16. This memory cell differs from the memory cell of the first embodiment shown in FIG. 1, in that the floating gate electrode 4 and the control gate electrode 6 made of polycrystalline silicon are replaced with a nickel silicide (NiSi) film 4a and a nickel silicide (NiSi) film 6a, respectively. As in the first embodiment, the interelectrode insulating film 5 of this embodiment is a three-layer structure that has the LaAlO$_x$ layer 5b interposed between the silicon nitride layers 5a and 5c that are continuous in the in-plane direction and have three-coordinate nitrogen bonds and at least one nitrogen atom among the second-nearest neighbor atoms of the nitrogen.

Unlike the nonvolatile semiconductor memory device of the first embodiment, the nonvolatile semiconductor memory device of this embodiment can reduce the width of the depletion layer extending in the floating gate electrode and the control gate electrode due to voltage application. Accordingly, an electric field can be effectively induced in the tunnel insulating film 3 and the interelectrode insulating film 5, and the write voltage can be lowered.

The material of the floating gate electrode 4a and the control gate electrode 6a is not limited to nickel silicide, and may be another silicide such as tungsten silicide. The above described FUSI (fully Silicided) gates have high consistency with the current processes, and introduction of FUSI gates into nonvolatile semiconductor memory devices of the next and later generations is being considered. In this embodiment, the FUSI gates effectively restrain mutual diffusion between the SI in the FUSI gate electrodes and the interelectrode insulating film 5.

The same effects as above can be achieved, if the material of the floating gate electrode 4a and the control gate electrode 6a is a metal compound such as tantalum nitride (TaN), tantalum carbide (TaC), or titanium nitride (TiN). Also, a metal material such as ruthenium (Ru) or tungsten (W) may be used.

Figure 17:
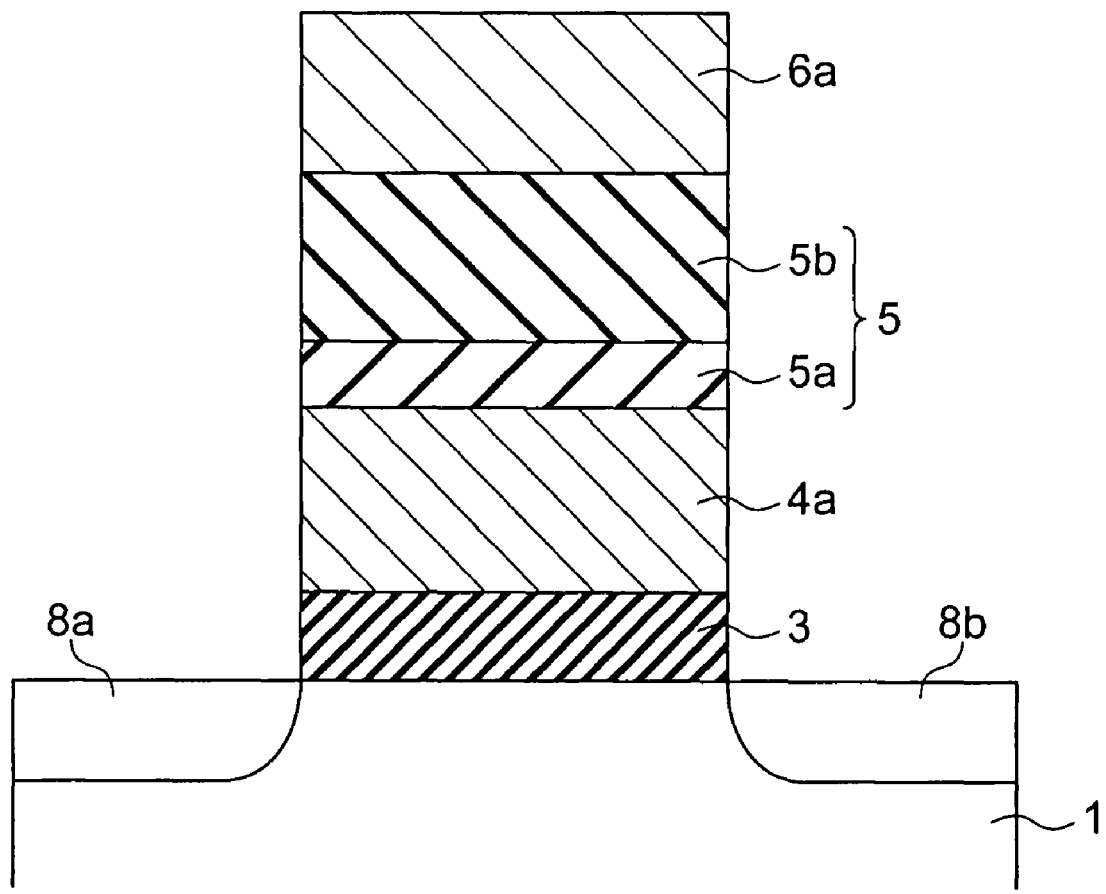
FIG. 17 is a cross-sectional view of the gate electrode in accordance with a first modification of the second embodiment.
Figure 18:
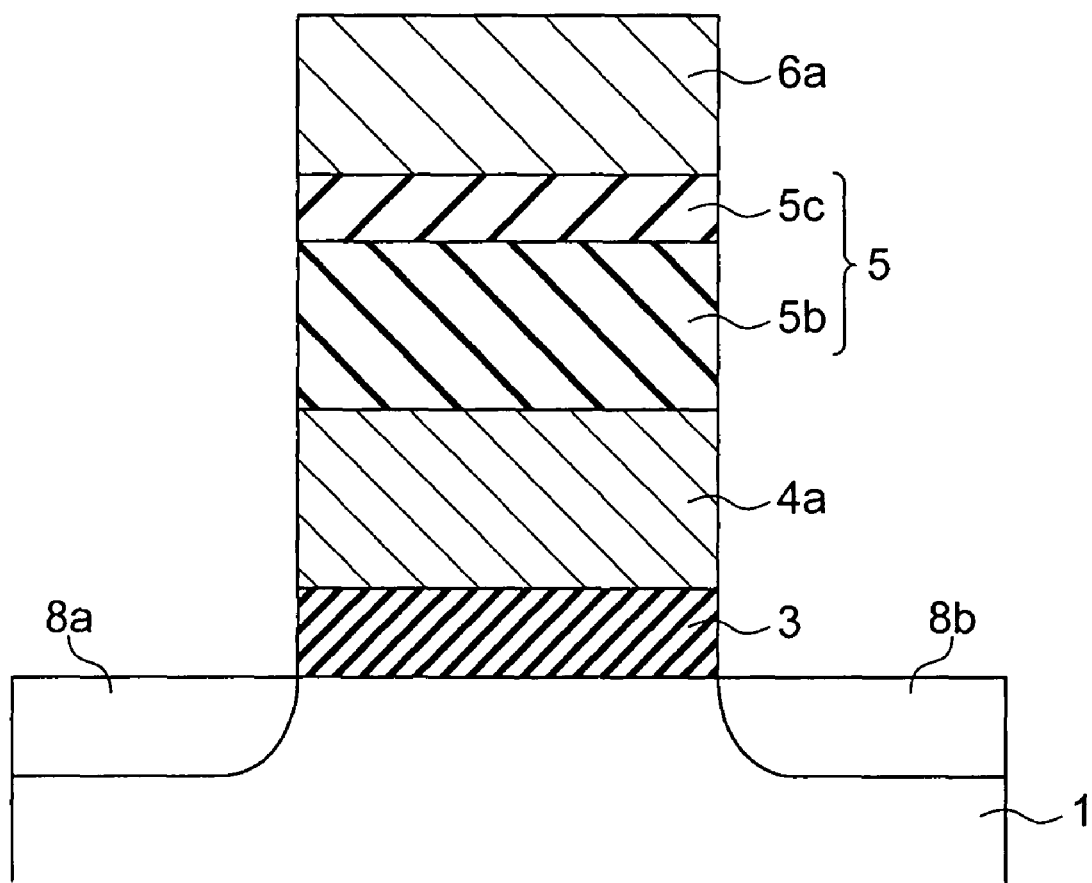
FIG. 18 is a cross-sectional view of the gate electrode in accordance with a second modification of the second embodiment.

For example, as in a first modification of this embodiment shown in FIG. 17, in a case where a metal electrode material not containing Si is used for the control gate electrode 6a, the interelectrode insulating film 5 may not have the silicon nitride layer 5c on the side of the interface with the control gate electrode 6a, and may be a two-layer structure consisting of the silicon nitride layer 5a and the LaAlO$_x$ layer 5b. In this manner, by eliminating the silicon nitride layer 5c, the manufacturing procedures can be simplified, and the effective film thickness of the blocking layer can be reduced. Also, in this embodiment, the floating gate electrode 4a is an electrode containing silicon, and the control gate electrode 6a is a metal electrode not containing silicon. However, in a case where the floating gate electrode is a metal electrode not containing silicon while the control gate electrode is an electrode containing silicon, the interelectrode insulating film 5 may not have the silicon nitride layer 5a on the side of the floating gate electrode 4a, and may have a two-layer structure consisting of the LaAlO$_x$ layer 5b and the silicon nitride layer 5c, as in a second modification shown in FIG. 18. In either case, the electrode containing silicon may be made of polycrystalline silicon, instead of silicide.

As described above, in accordance with this embodiment, mutual diffusion between an electrode (the floating gate electrode or the control gate electrode) containing silicon and the interelectrode insulating film can be prevented by virtue of high-quality silicon nitride layers provided in the interfaces of the interelectrode insulating film made of a high-permittivity material. Thus, degradation of device characteristics, such as write, erase, and charge retention characteristics, can be prevented.

Third Embodiment

Figure 19:
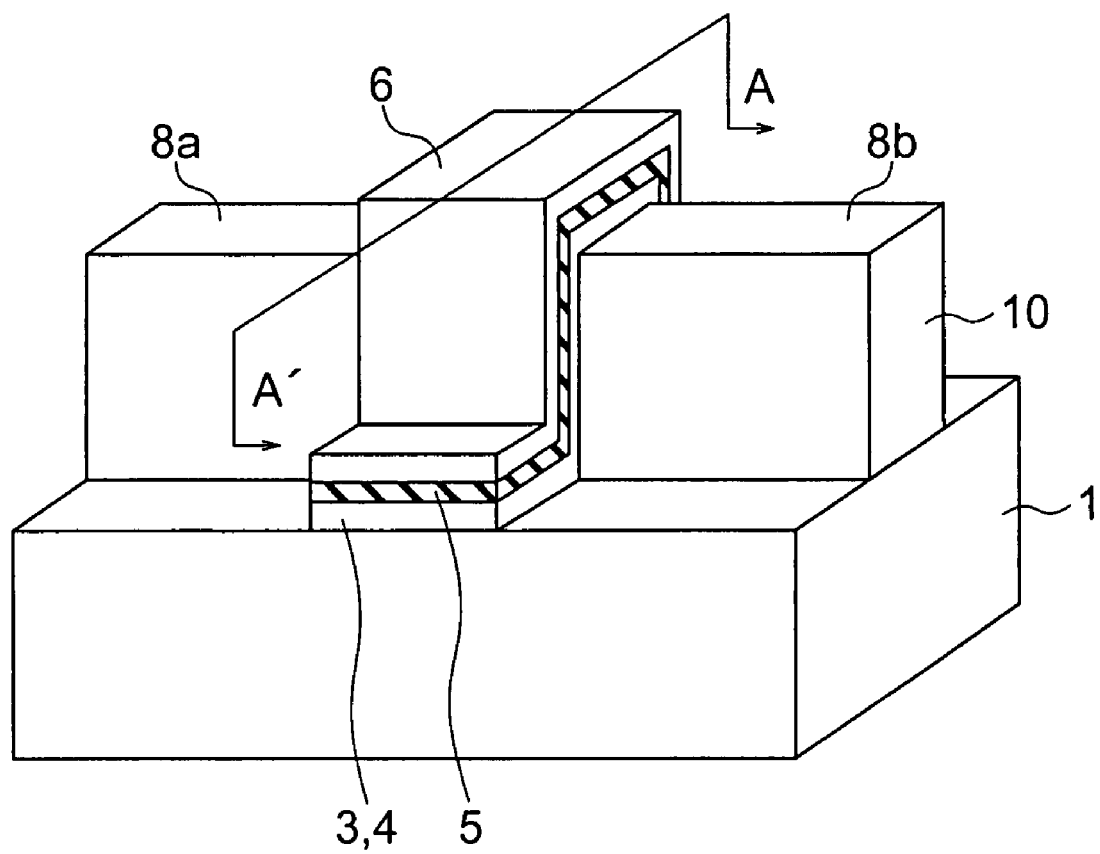
FIG. 19 is a perspective view of a memory cell of a fin-type nonvolatile semiconductor memory device in accordance with a third embodiment.

Referring now to FIG. 19, a fin-type nonvolatile semiconductor memory device in accordance with a third embodiment of the present invention is described. The fin-type nonvolatile semiconductor memory device of this embodiment contains at least one memory cell shown in FIG. 19.

The fin-type nonvolatile semiconductor memory device is a nonvolatile memory device that includes memory cells each having a transistor formed in a plate-like semiconductor element region 10 that is called a fin shown in FIG. 19. The fin-type nonvolatile semiconductor memory device is effective in miniaturization, high integration, short-channel effect prevention, and the likes.

The fin-type nonvolatile semiconductor memory device of this embodiment has the plate-like semiconductor element region 10 formed on a silicon substrate 1. A source region 8a and a drain region 8b having a different conductivity type from that of the semiconductor element region 10 are formed in the plate-like semiconductor element region 10. The source region 8a and the drain region 8b are located at a distance from each other in the extending direction of the semiconductor element region 10. A gate electrode unit that is a stack structure consisting of a tunnel insulating film 3, a floating gate electrode 4, an interelectrode insulating film 5, and a control gate electrode 6 is provided to cover the side faces and the up face of the portion of the semiconductor element region 10 located between the source region 8a and the drain region 8b.

In this embodiment, the interelectrode insulating film 5 has a stack structure consisting of silicon nitride layers and a high-permittivity insulating layer, and the silicon nitride layers have three-coordinate nitrogen bonds agglomerated at high density, as in the first embodiment. With this structure, the same effects as those of the first embodiment can be achieved.

Referring now to FIGS. 20A through 21D, a method for manufacturing the fin-type nonvolatile semiconductor memory device of this embodiment is described. FIGS. 20A through 21D are cross-sectional views, taken along the line A-A' of FIG. 19. Each of the cross-sectional views illustrates a manufacturing procedure.

Figure 20A:
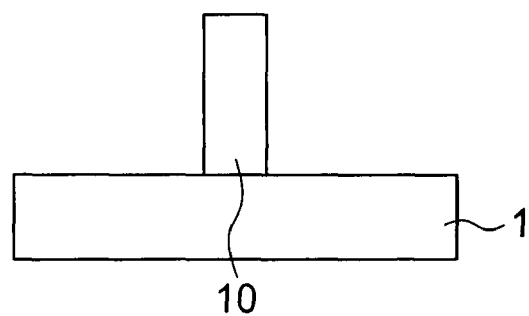
FIGS. 20A through 20D are cross-sectional views illustrating the procedures for manufacturing the nonvolatile semiconductor memory device in accordance with the third embodiment.
Figure 20B:
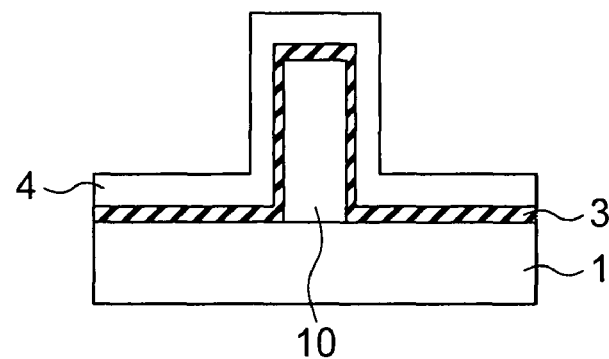
Figure 20C:
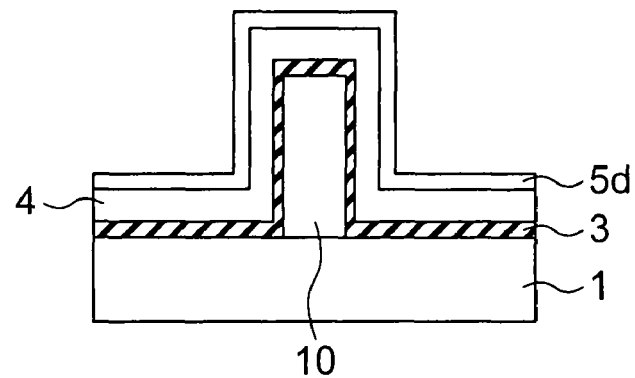
Figure 20D:
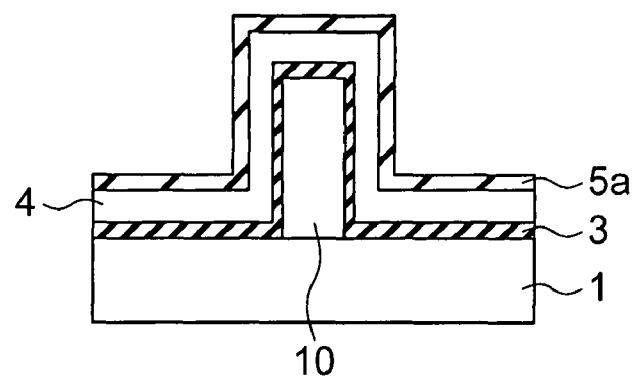

First, as shown in FIG. 20A, the plate-like semiconductor element region 10 is formed on the silicon substrate 1. A silicon oxynitride film as the tunnel insulating film 3 and a polycrystalline silicon film as the floating gate electrode 4 are then deposited in this order on the element region 10, as shown in FIG. 20B. A flat amorphous silicon layer 5d of approximately 0.5 nm in thickness is then formed on the floating gate electrode 4 with the use of a disilane gas, as shown in FIG. 20C. At this point, the procedure for increasing the number of surface dangling bonds may be additionally carried out immediately before the amorphous silicon is deposited, as described in the first and second embodiments. The amorphous silicon layer 5d is then directly nitrided through plasma nitridation using a nitriding gas that is diluted fivefold with Ar with the pressure of 40 Torr (5320 Pa) and at the temperature of 700° C., as shown in FIG. 20D. In this manner, a silicon nitride layer 5a of approximately 1 nm in thickness is formed.

Figure 21A:
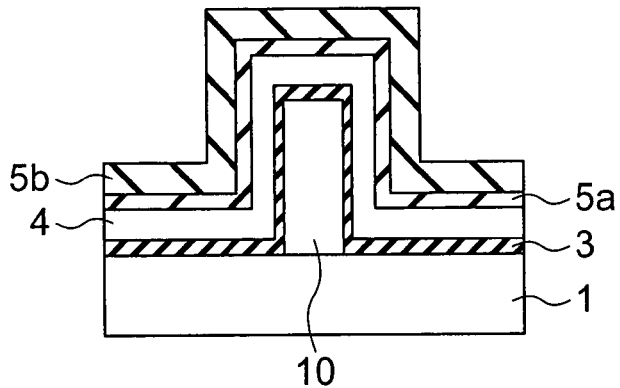
FIGS. 21A through 21D are cross-sectional views illustrating the procedures for manufacturing the nonvolatile semiconductor memory device in accordance with the third embodiment.
Figure 21B:
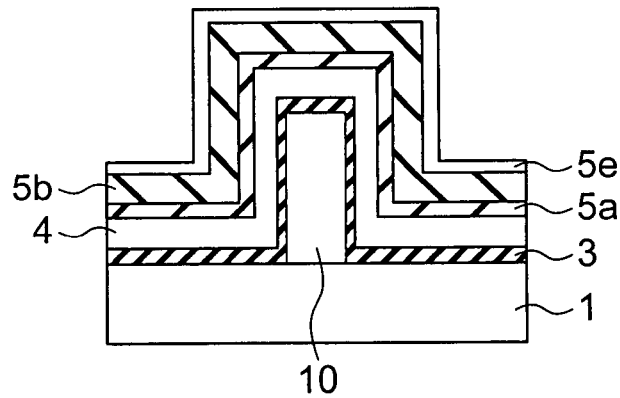
Figure 21C:
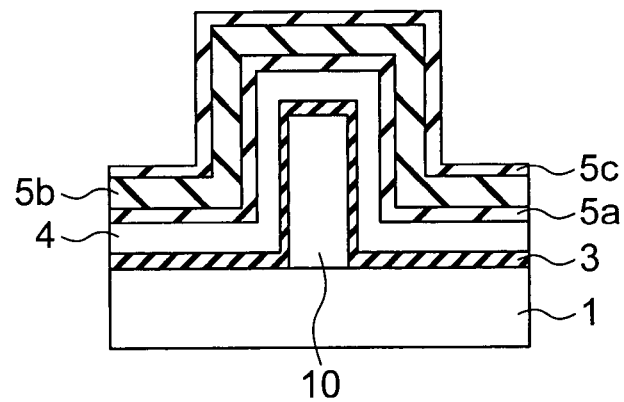
Figure 21D:
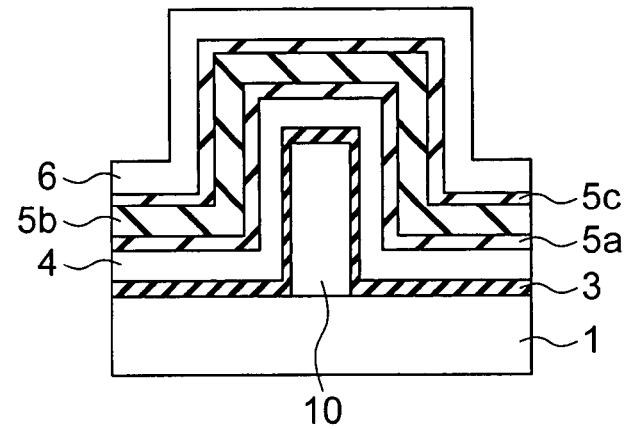

A LaAlO$_x$ layer 5b of 15 nm in thickness, for example, is then deposited by CVD method on the silicon nitride layer 5a, as shown in FIG. 21A. A flat amorphous silicon layer 5e of approximately 0.5 nm in thickness is then formed on the LaAlO$_x$ layer 5b with the use of a disilane gas, as shown in FIG. 21B. At this point, the procedure for increasing the number of surface dangling bonds may be additionally carried out immediately before the amorphous silicon is deposited, as in the procedure for depositing the amorphous silicon layer 5d. The amorphous silicon layer 5e is then directly nitrided through plasma nitridation using a nitriding gas that is diluted fivefold with Ar with the pressure of 40 Torr (5320 Pa) and at the temperature of 700° C., as shown in FIG. 21C. In this manner, a silicon nitride layer 5c of approximately 1 nm in thickness is formed. A 200-nm thick n-type polycrystalline silicon film having phosphorus added thereto is then deposited as the control gate electrode 6 on the silicon nitride layer 5c, as shown in FIG. 21D.

Although not shown in the drawings, patterning is then performed with the use of a resist mask, as in the first and second embodiments. Reactive ion etching is then performed on the polycrystalline silicon film as the control gate electrode 6, the silicon nitride layer 5c, the LaAlO$_x$ layer 5b, the silicon nitride layer 5a, the polycrystalline silicon film as the floating gate electrode 4, and the tunnel insulating film 3. In this manner, the gate electrode unit is formed. After the resist mask is removed, heat treatment is carried out in an oxygen atmosphere for the purpose of recovery from processing damage or the like, and a post-oxidation film of approximately 3 nm is formed. Phosphorus ions are then implanted into the entire surface at 3×10$^{15}$ cm$^{-2}$ Heat treatment is carried out at 1000° C. for 20 seconds, so as to diffuse and activate the phosphorus ions in the silicon substrate. In this manner, the source region 8a and the drain region 8b are formed.

A 300-nm thick silicon oxide film, for example, is then deposited by CVD method on the entire surface, and a contact hole is formed in the silicon oxide film by anisotropic dry etching. A 800-nm thick aluminum film containing silicon and copper by 0.5% each is formed to fill the contact hole, and patterning is performed on the aluminum film, so as to form an electrode. After that, heat treatment is carried out in a nitrogen atmosphere containing 10% hydrogen at 450° C. for 15 minutes.

As described above, in accordance with this embodiment, it is possible to form a fin-type nonvolatile memory that has a high-quality tunnel insulating film with high reliability, and is effective in miniaturization, high integration, and short-channel effect prevention.

In the first through third embodiments, floating-gate nonvolatile semiconductor memory devices have been described as examples. However, the present invention can be applied to other semiconductor devices, to achieve the same effects as above.

Fourth Embodiment

Figure 22:
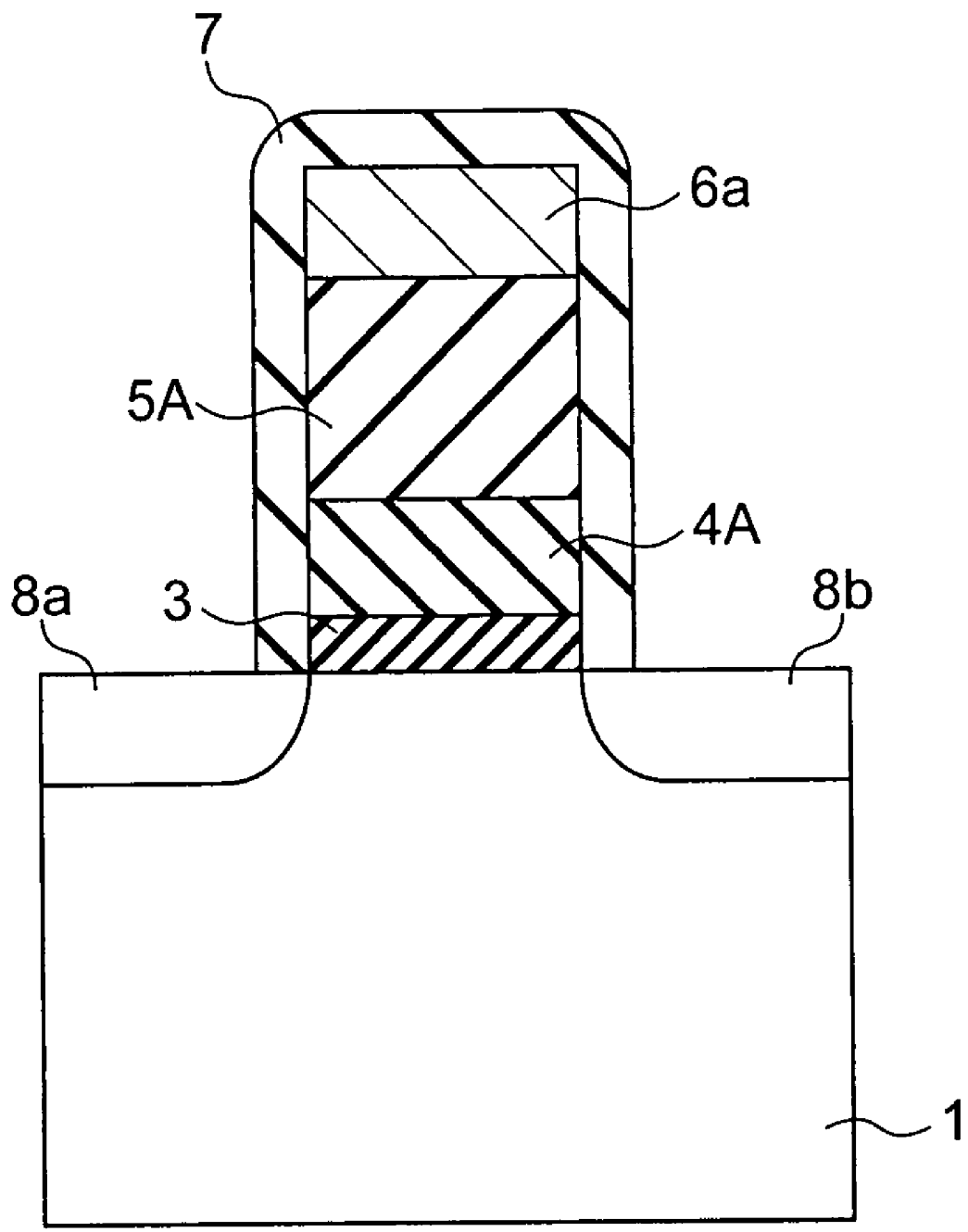
FIG. 22 is a cross-sectional view of a memory cell of a MONOS nonvolatile semiconductor memory device in accordance with a fourth embodiment.

Referring now to FIG. 22, a MONOS (Metal-Oxide-Nitride-Oxide-Si) nonvolatile semiconductor memory device in accordance with a fourth embodiment of the present invention is described. The MONOS nonvolatile semiconductor memory device of this embodiment contains at least one memory cell shown in FIG. 22.

In the memory cell of this embodiment, a source region 8a and a drain region 8b are formed at a distance from each other on the principal face of a p-type silicon substrate 1. A gate electrode unit formed with a stack structure consisting of a tunnel insulating film 3, a charge storage film 4A, a blocking film 5A, and a control gate electrode 6a is formed on the portion of the silicon substrate 1 located between the source region 8a and the drain region 8b. An insulating film 7 made of silicon oxide is further formed on the side faces and the top face of the gate electrode unit. The tunnel insulating film 3 may be formed with a silicon oxynitride film, the charge storage film 4A may be formed with a silicon nitride film, and the control gate electrode 6a may be formed with a nickel silicide film, for example. The source region 8a and the drain region 8b are formed by implanting phosphorus ions, for example, with the gate electrode unit serving as a mask.

Figure 2:
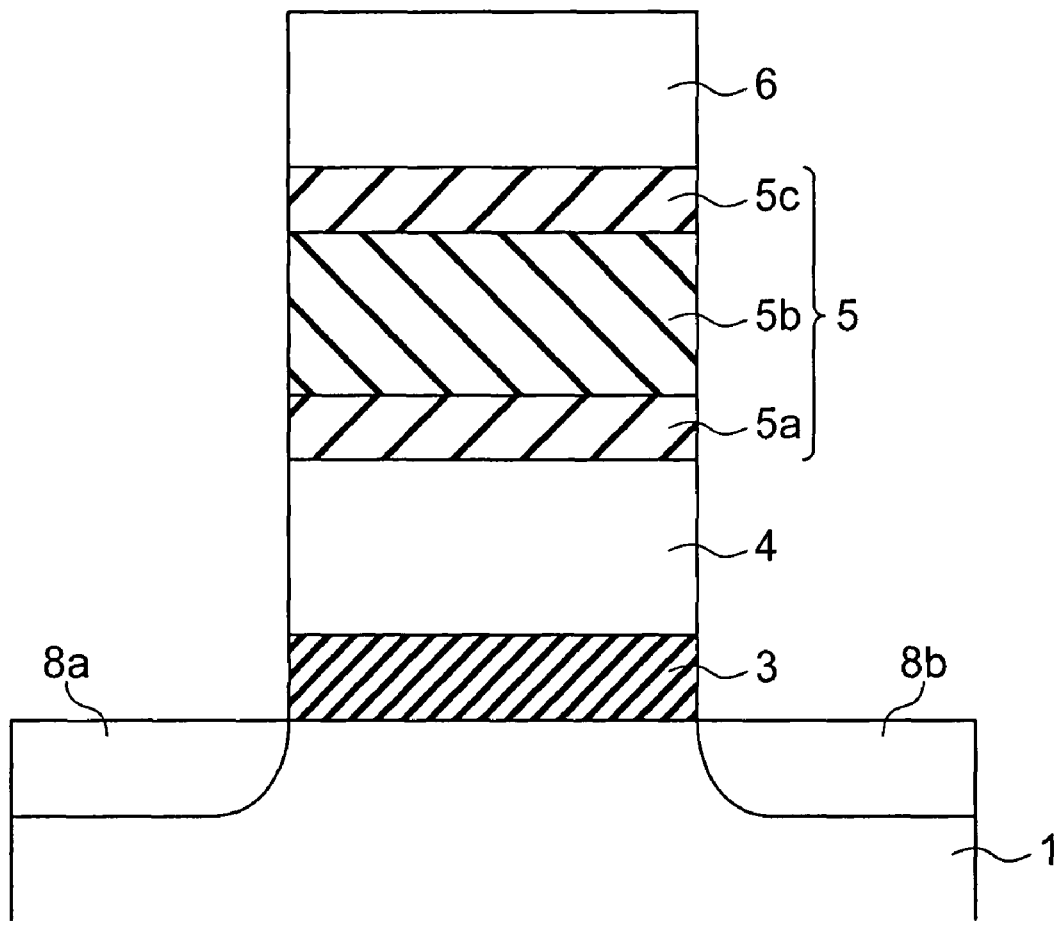
FIG. 2 is a cross-sectional view of the gate electrode of the memory cell in accordance with the first embodiment.
Figure 23:
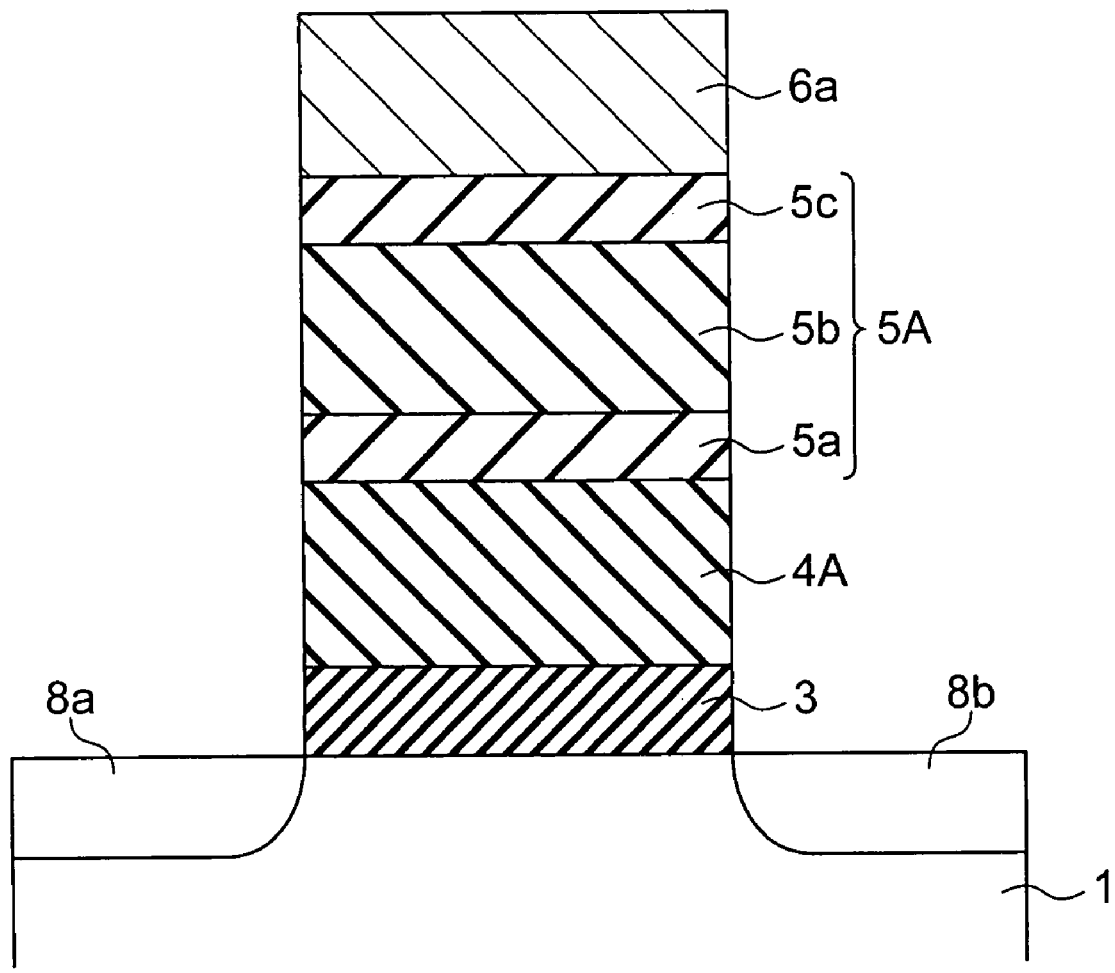
FIG. 23 is a cross-sectional view of the gate electrode of the memory device in accordance with the forth embodiment.

The blocking film 5A of this embodiment has a different structure from the structure of the blocking film of a conventional MONOS nonvolatile semiconductor memory device. The blocking film 5A of this embodiment has the same structure as the structure of the interelectrode insulating film 5 of the first embodiment shown in FIG. 2. As shown in FIG. 23, the blocking film 5A is a three-layer structure that has a LaAlO$_x$ layer 5b interposed between silicon nitride layers 5a and 5c that are continuous in the in-plane direction and have three-coordinate nitrogen bonds and at least one nitrogen atom among the second-nearest neighbor atoms of the nitrogen. Since the silicon nitride layers 5a and 5c have three-coordinate nitrogen bonds, the nitrogen bonds are stable and cannot be easily cut off even when subjected to high-temperature heat treatment, as described in the first embodiment.

In accordance with this embodiment, even when high-temperature heat treatment is carried out, interfacial reactions in the interface between the blocking film 5A and the charge storage film 4A and in the interface between the blocking film 5A and the control gate electrode 6a can be restrained.

The film thickness of each of the silicon nitride layers 5a and 5c is preferably 0.4 nm to 1 nm. If the film thickness is 0.4 nm or more, stable properties as a film can be easily achieved. If the film thickness is 1 nm or less, a high-quality nitride layer can be formed at a higher speed. To prevent variations, the film thickness of the silicon nitride layer 5a should preferably be 0.7 nm or more.

As described above, in the nonvolatile semiconductor memory device of this embodiment, the $LaAlO_x$ layer 5b is interposed between the silicon nitride layers 5a and 5c that have three-coordinate nitrogen bonds and at least one nitrogen atom among the second-nearest neighbor atoms of the nitrogen. With this there-layer structure, mutual diffusion in the interface between the blocking film 5A and the silicon nitride film as the charge storage film 4A and in the interface between the blocking film 5A and the nickel silicide film as the control gate electrode 6a can be restrained when heat treatment is carried out at a high temperature. Thus, the heat resistance of the blocking film 5A can be made higher. Also, each memory cell can be made smaller, and the device characteristics such as write, erase, charge retention characteristics of each memory cell (device) and its reliability can be improved as the interfacial characteristics are improved.

Also, in accordance with this embodiment, it is possible to use the $LaAlO_x$ film 5b, which is a high-permittivity material, as the blocking film 5A between the charge storage film 4A and the control gate electrode 6a. Accordingly, the coupling ratio between the charge storage film 4A and the control gate electrode 6a can be made higher. Thus, while each memory cell can be made smaller, the device characteristics such as write, erase, charge retention characteristics and the reliability can be improved as the interfacial characteristics are improved.

Unlike a gate electrode made of polycrystalline silicon, the control gate electrode 6a made of nickel silicide can reduce the width of the depletion layer extending in the electrodes due to voltage application. Accordingly, the write voltage can be lowered.

Referring now to FIGS. 24A through 26C, a method for manufacturing the MONOS nonvolatile semiconductor memory device in accordance with this embodiment is described.

Figure 24A:
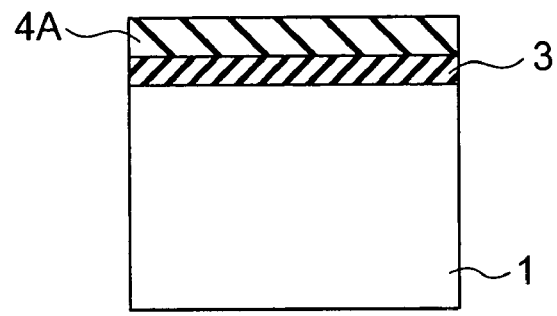
FIGS. 24A through 24D are cross-sectional views illustrating the procedures for manufacturing the MONOS-type nonvolatile semiconductor memory device in accordance with the fourth embodiment.
Figure 24B:
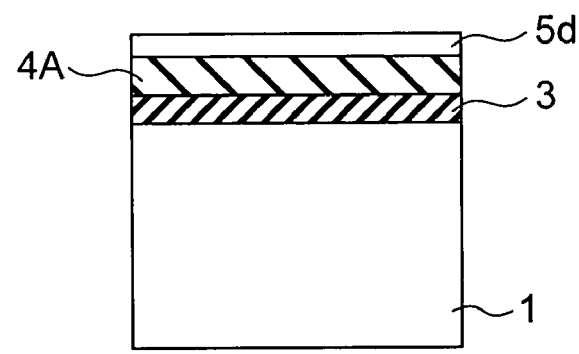

First, as shown in FIG. 24A, a p-type silicon substrate 1 having a plane orientation (100) and specific resistance of 10 Ωcm to 20 Ωcm is prepared. A silicon oxynitride film as the tunnel insulating film 3 and a silicon nitride film as the charge storage film 4A are deposited on the silicon substrate 1 by CVD method, for example. As shown in FIG. 24B, a flat amorphous silicon layer 5d of approximately 0.5 nm in thickness is formed on the charge storage film 4A, using a disilane gas, for example. A procedure for increasing the surface dangling bonds may be carried out immediately before the amorphous silicon is deposited. By increasing the number of dangling bonds on the surface on which the amorphous silicon is to be deposited, an insulating film with excellent flatness and insulation properties can be formed.

Figure 24C:
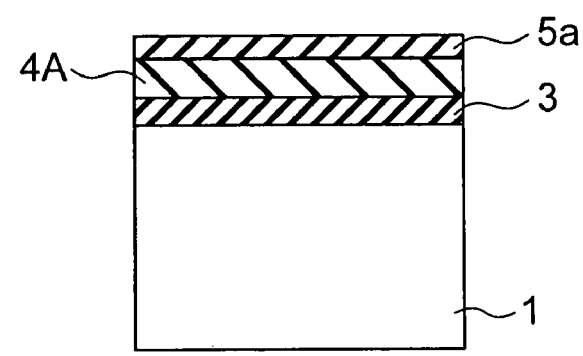
Figure 24D:
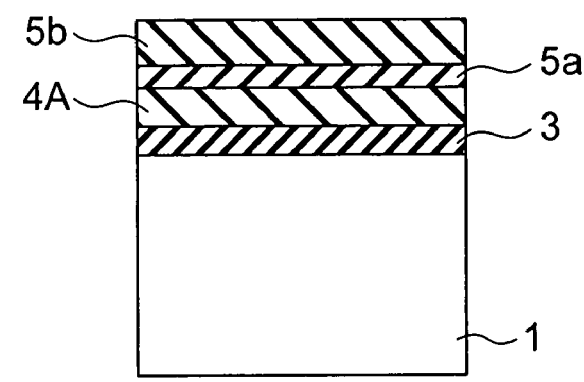

As shown in FIG. 24C, the amorphous silicon layer 5d is directly nitrided through plasma nitridation with the pressure of 40 Torr (5320 Pa) and at the temperature of 700° C., with the use of a nitriding gas that is diluted fivefold with Ar. In this manner, the silicon nitride layer 5a of approximately 1 nm in thickness is formed. As shown in FIG. 24D, the $LaAlO_x$ layer 5b of 15 nm in thickness, for example, is formed on the silicon nitride layer 5a by CVD method.

Figure 25A:
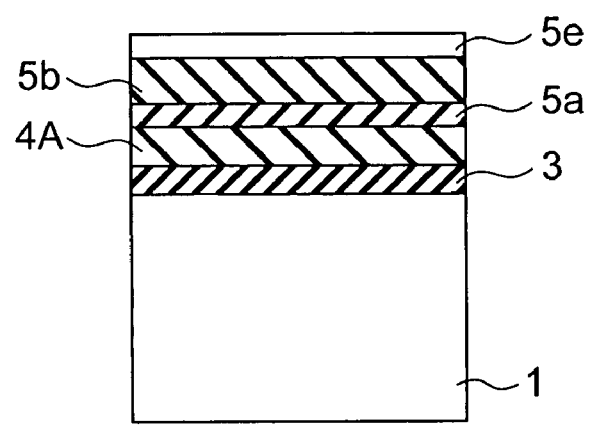
FIGS. 25A through 25C are cross-sectional views illustrating the procedures for manufacturing the MONOS-type nonvolatile semiconductor memory device in accordance with the fourth embodiment.
Figure 25B:
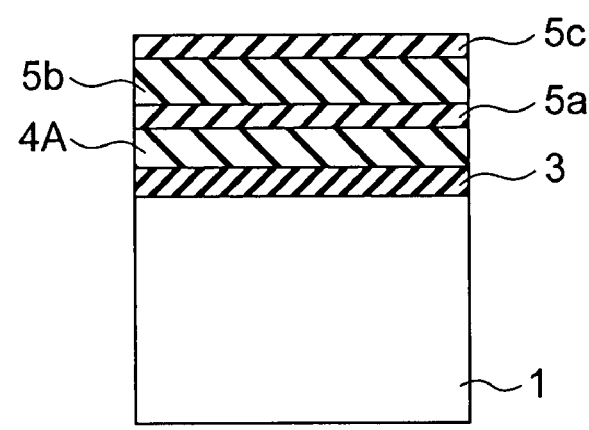

As shown in FIG. 25A, a flat amorphous silicon layer 5e of approximately 0.5 nm in thickness is formed on the $LaAlO_x$ layer 5b, using a disilane gas, for example. As in the procedure for depositing the amorphous silicon layer 5d, a procedure for increasing the surface dangling bonds may be carried out immediately before the amorphous silicon is deposited. As shown in FIG. 25B, the amorphous silicon layer 5e is directly nitrided through plasma nitridation with 40 Torr (5320 pa) and at 700° C., with the use of a nitriding gas that is diluted fivefold with Ar. In this manner, the silicon nitride layer 5c of approximately 1 nm in thickness is formed.

Figure 25C:
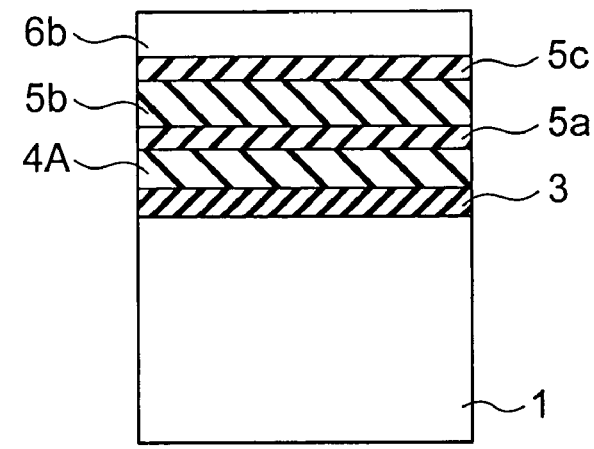
Figure 26A:
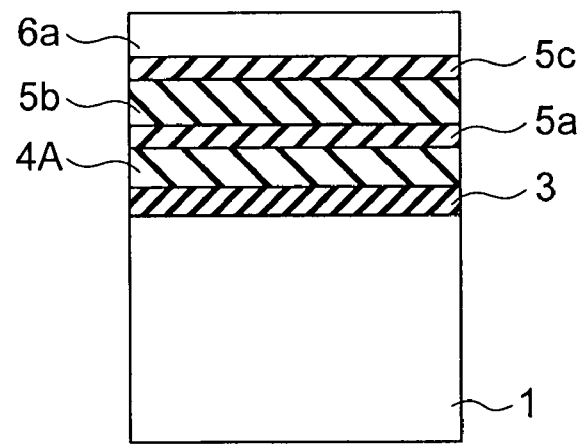
FIGS. 26A through 26C are cross-sectional views illustrating the procedures for manufacturing the MONOS-type nonvolatile semiconductor memory device in accordance with the fourth embodiment.

As shown in FIG. 25C, a flat amorphous silicon film 6b of approximately 20 nm in thickness to be the control gate electrode 6a is deposited on the silicon nitride layer 5c, with the use of a disilane gas, for example. Nickel (Ni) sputter deposition is then carried out, and heat treatment is carried out at 400° C. Selective etching is then performed on unreacted metal. In this manner, the control gate electrode 6a made of nickel silicide is formed in a self-aligning manner, as shown in FIG. 26A.

Figure 26B:
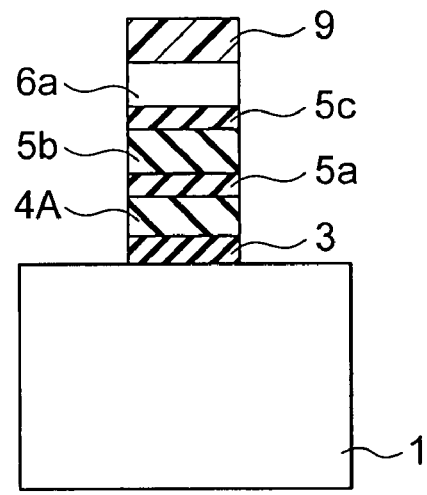

As shown in FIG. 26B, after a resist mask 9 of photoresist is formed on the control gate electrode 6a by a lithography technique, reactive ion etching with the use of the resist mask 9 is performed on the stacked film structure consisting of the nickel silicide film as the control gate electrode 6a, the silicon nitride layer 5c, the $LaAlO_x$ layer 5b, the silicon nitride layer 5a, the silicon nitride film as the charge storage film 4A, and the tunnel insulating film 3. In this manner, the gate electrode unit is formed. After the resist mask 9 is removed, heat treatment is carried out in an oxygen atmosphere for the purpose of recovery from processing damage or the like, and a post-oxidation film 7 of approximately 3 nm is formed.

Figure 26C:
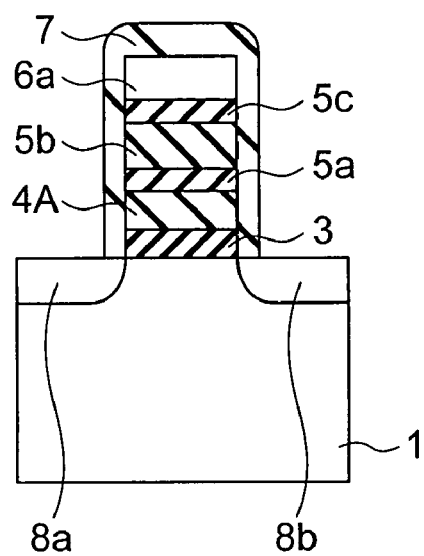

Phosphorus ions are then implanted into the entire surface at $3 \times 10^{15}$ cm$^{-2}$, for example. Heat treatment is then carried out at 1000° C. for 20 seconds, for example, so as to diffuse and activate the phosphorus ions in the silicon substrate 1. In this manner, the source region 8a and the drain region 8b are formed, and the structure shown in FIG. 26C is obtained.

Although not specifically shown in the drawings, an interlayer insulating film is then deposited by CVD method, and a contact hole is formed. An aluminum film is deposited to fill the contact hole, and patterning is performed to form an electrode. Heat treatment is then carried out in a nitrogen atmosphere, so as to complete the memory device.

In this embodiment, each silicon nitride layer is formed by nitriding an amorphous silicon layer. However, it is also possible to use a polycrystalline silicon layer, instead of an amorphous silicon layer. To flatten the blocking film, it is preferable to use an amorphous silicon thin film. Furthermore, to form a nitride layer structure in which nitrogen atoms and nitrogen compounds can be easily diffused and bonded in the film at the time of nitridation, it is more preferable to use an amorphous silicon thin film than to use a crystalline silicon layer. To form silicon nitride layers having three-coordinate nitrogen bonds, the amorphous silicon layers formed in the procedures shown in FIGS. 24B and 25A need to be continuous flat films. If nitridation is performed on discontinuous amorphous silicon layers having silicon "islands (nuclei)" in a scattered state, thin spots and non-nitrided silicon atoms remain in the silicon layers. This is not preferable in view of the insulation properties.

Another important aspect in this embodiment is to perform complete nitridation on silicon layers in the procedures shown in FIGS. 24C and 25B. When silicon is completely nitrided, the network between silicon and nitrogen is established, and the high-density three-coordinate nitrogen bonds can be formed. In this manner, nitride films with fewer defects and higher reliability can be formed.

A nitride film having a poor bonding state that might result in numerous defects in the film may be used as the silicon nitride film to be the charge storage film 4A. By increasing the defects such as two-coordinate nitrogen bonds in the film, the amount of charge to be stored can be increased.

As described above, in accordance with this embodiment, high-quality silicon nitride layers are provided in the interfaces of the blocking film made of a high-permittivity material. With this arrangement, mutual diffusion between an electrode (the control gate electrode) containing silicon and the blocking film can be prevented. Thus, degradation of device characteristics, such as write, erase, and charge retention characteristics, can be prevented.

The floating gate electrode of each of the floating-gate nonvolatile semiconductor memory devices of the first through third embodiments may be replaced with the charge storage film 4A of this embodiment, so as to form a MONOS nonvolatile semiconductor memory device. In such a case, the interelectrode insulating film 5 serves as the blocking film 5A.

Fifth Embodiment

Figure 27:
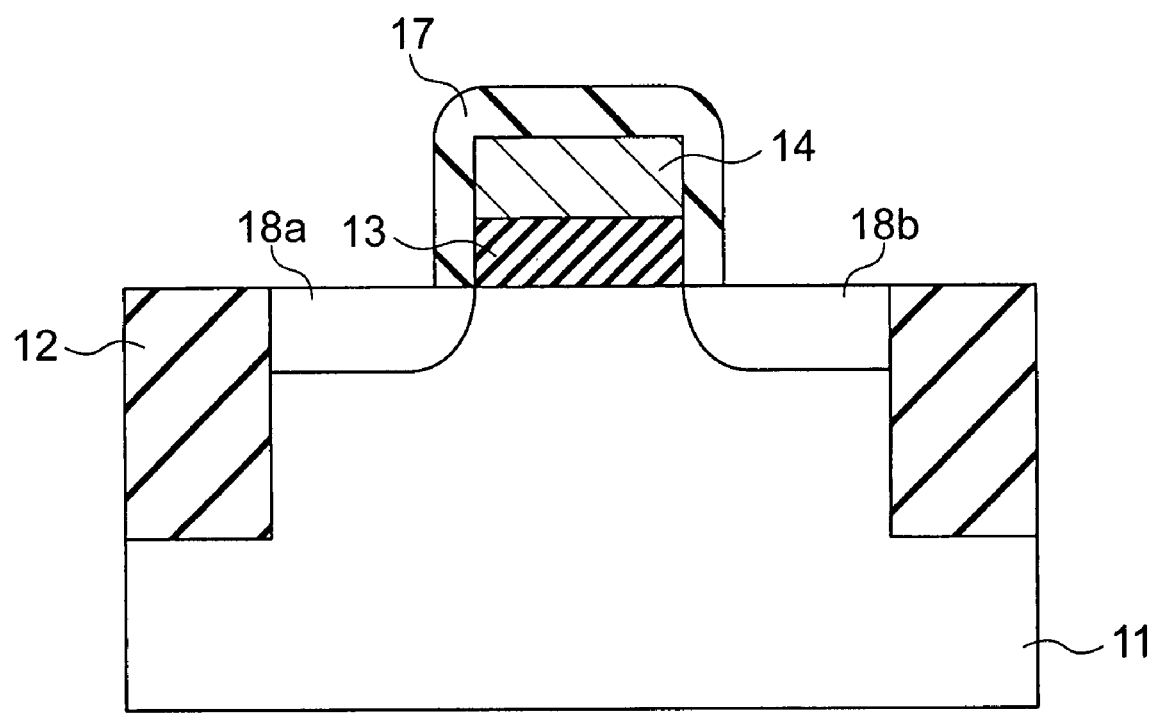
FIG. 27 is a cross-sectional view of a MISFET in accordance with a fifth embodiment of the present invention.
Figure 28:
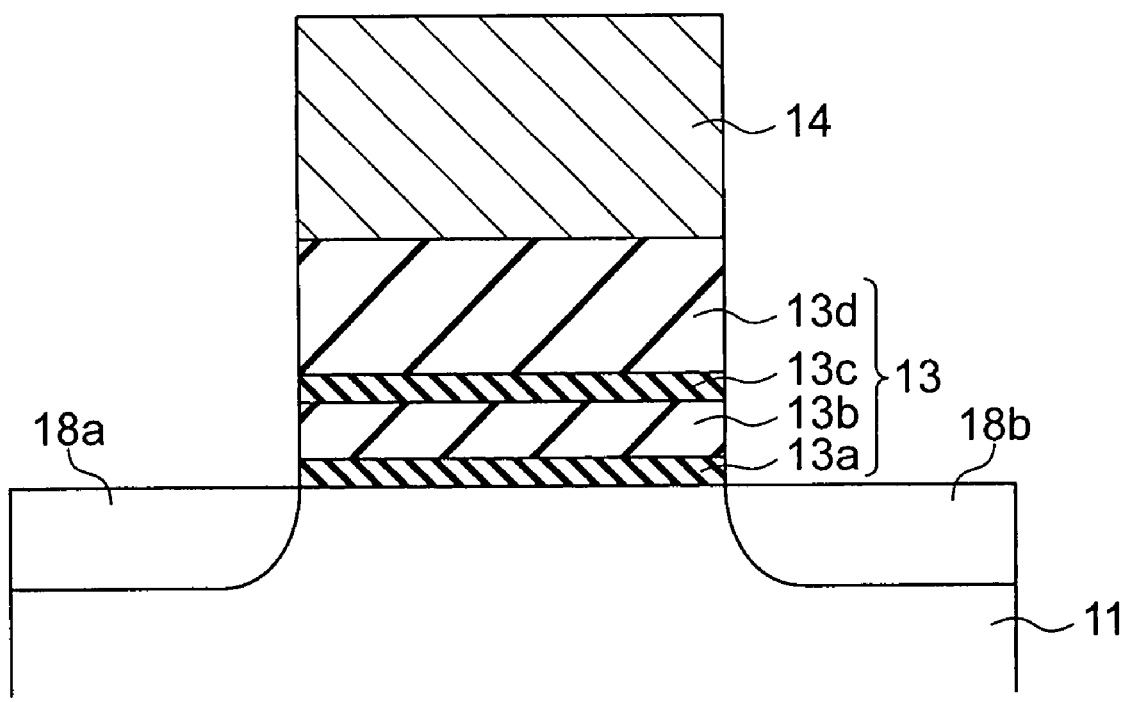
FIG. 28 is a cross-sectional view showing the gate structure of the MISFET of the fifth embodiment.

Referring now to FIG. 27, a semiconductor device in accordance with a fifth embodiment of the present invention is described. The semiconductor device of this embodiment is a field effect transistor having metal/insulator/semiconductor junctions (a MISFET), and FIG. 27 is a cross-sectional view of the MISFET.

In the MISFET of this embodiment, a thermally-oxidized silicon film (a device isolation insulating film) 12 for device isolation is formed to surround a device formation region of the principal face of a p-type silicon substrate 11, and is embedded in the substrate 11. In the device formation region of the silicon substrate 11, an n-type source region 18a and an n-type drain region 18b are formed at a distance from each other. A gate insulating film 13 is formed on the portion of the device formation region located between the source region 18a and the drain region 18b, and a gate electrode 14 made of nickel silicide (NiSi) is formed on the gate insulating film 13. Further, a silicon oxide film 17 is formed on the side portions of a gate unit formed with the gate insulating film 13 and the gate electrode 14.

The gate insulating film 13 of this embodiment differs from the gate insulating film of a conventional MISFET. More specifically, in this embodiment, the gate insulating film 13 is a four-layer structure consisting of a silicon oxide layer 13a, a silicon nitride layer 13b, a silicon oxide layer 13c, and a HfSiON layer 13d that are stacked in this order on the silicon substrate 11. The silicon nitride layer 13b is continuous in the in-plane direction, and has three-coordinate nitrogen bonds and at least one nitrogen atom among the second-nearest neighbor atoms of the nitrogen.

Here, the silicon oxide layers 13a and 13b are formed with oxygen desorbed from the HfSiON layer 13d, as described later. The silicon oxide layers 13a and 13b are thin and have high reliability.

Figure 29:
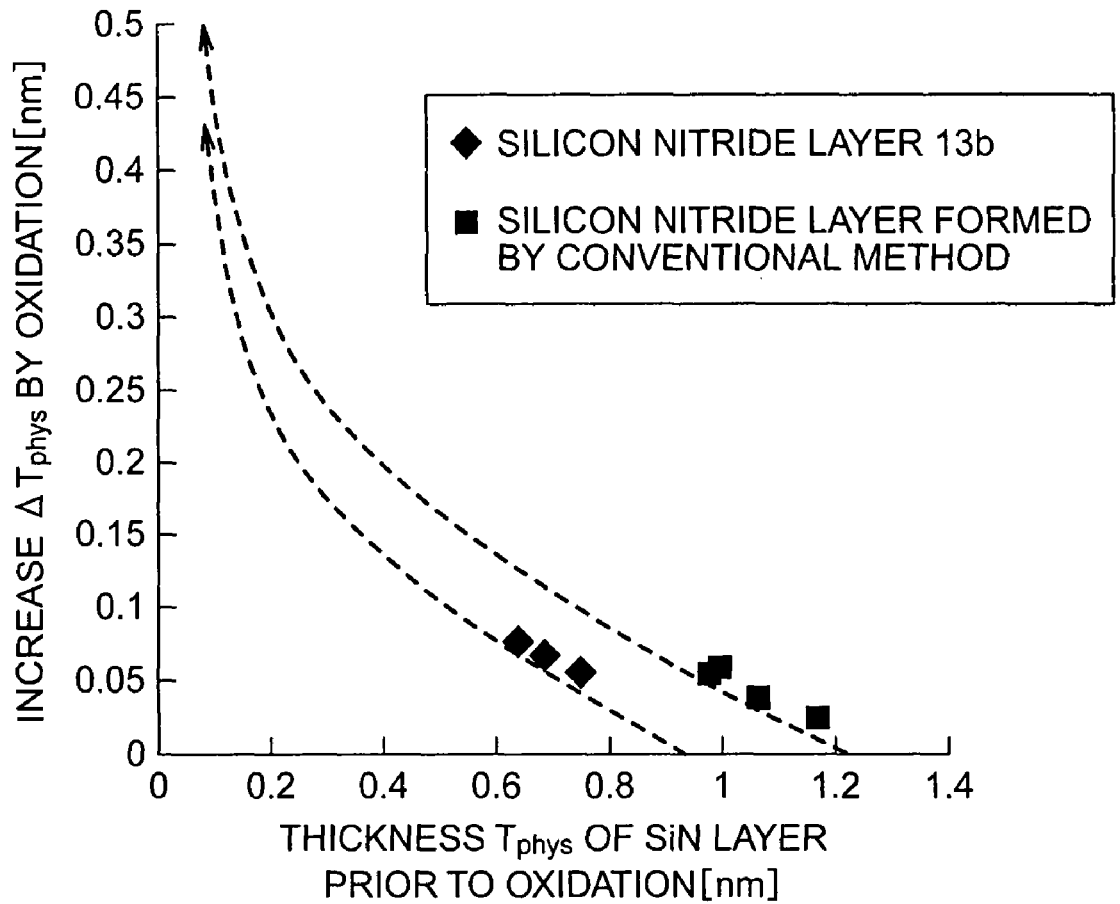
FIG. 29 shows the relationship between the layer thickness of a silicon nitride layer prior to oxidation and the increase in layer thickness after the oxidation, where the silicon nitride layer is oxidized.

FIG. 29 shows the results of evaluations that were carried out on an oxidized silicon nitride layer where the physical layer thickness $T_{phys}$ of the silicon nitride layer prior to oxidation and the increased physical layer thickness $\Delta T_{phys}$ of the silicon oxide layer after the oxidation were evaluated by ellipsometry. The oxidation was performed at 950° C. for 30 seconds, using an $O_2$ gas that has the total pressure of 30 Torr and is diluted to the partial pressure of 3 Torr with a dilution gas $N_2$. Under such conditions, a 1.8 nm silicon oxide layer was formed on bare silicon (a silicon substrate). Two silicon nitride layers were used for the evaluations. One of the two silicon nitride layers had high film quality, like the silicon nitride layer 13b (having three-coordinate nitrogen bonds and at least one nitrogen atom among the second-nearest neighbor atoms of the nitrogen). The other one of the two silicon nitride layers was produced in a conventional manner. As can be seen from FIG. 29, the increase in layer thickness is smaller, when the layer thickness of the silicon nitride layer prior to oxidation is larger or the quality of the silicon nitride layer prior to oxidation is higher. This result shows that oxidation of the substrate interface due to the oxygen desorbed from the HfSiON layer can be restrained in this embodiment.

Further, in this embodiment, the silicon nitride layer 13b having higher permittivity than a silicon oxide layer is formed in the interface between the HfSiON layer 13d and the substrate 11, so that the device can be electrically thinned.

In the silicon nitride layer 13b, nitrogen atoms are agglomerated at high concentration, and are strongly bonded. Therefore, further nitridation is not easily caused. With such characteristics, the silicon nitride layer 13b also serves as a blocking film that prevents nitrogen diffusion into the substrate when plasma nitridation or ammonia nitridation is performed on the HfSiO layer so as to restrain crystallization.

Also, an interface with excellent interfacial characteristics (fewer defects such as interface states) and high reliability can be formed by performing oxidation through a silicon nitride layer that is continuous in the in-plane direction and has three-coordinate nitrogen bonds and at least one nitrogen atom among the second-nearest neighbor atoms of the nitrogen, like the silicon nitride layer 13b. The inventors already discovered this fact, and have filed a patent application concerning the discovery (Japanese Patent Application No. 2006-176863).

The film thickness of the silicon nitride layers 13b is preferably 1 nm or less. If the film thickness is 0.4 nm or more, stable properties as a film can be easily achieved. If the film thickness is 1 nm or less, a high-quality nitride layer can be formed at a higher speed. To avoid variations, the film thickness of the silicon nitride layer 13b should preferably be 0.7 nm or more.

Referring now to FIGS. 30A through 31D, a method for manufacturing the MISFET of this embodiment is described. FIGS. 30A through 31D are cross-sectional views showing the procedures for manufacturing the MISFET in accordance with this embodiment.

Figure 30A:
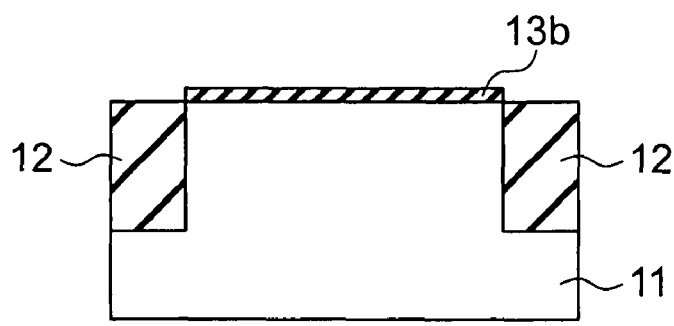
FIGS. 30A through 30D are cross-sectional views showing the procedures for manufacturing the MISFET in accordance with the fifth embodiment.

First, as shown in FIG. 30A, the p-type silicon substrate 11 is prepared, and grooves are formed in the surface of the silicon substrate 11. The grooves are filled with a CVD method oxide film, so as to form the device isolation insulating film 12 of approximately 0.6 μm in thickness. The silicon substrate 11 is then directly nitrided through plasma nitridation using a nitriding gas diluted fivefold with Ar at the temperature of 700° C. and with the pressure of 400 Torr (5320 Pa). In this manner, the silicon nitride layer 13b of approximately 1 nm in thickness is formed.

Figure 30B:
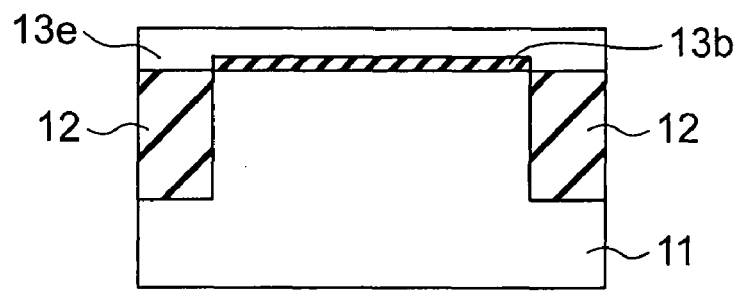
Figure 30C:
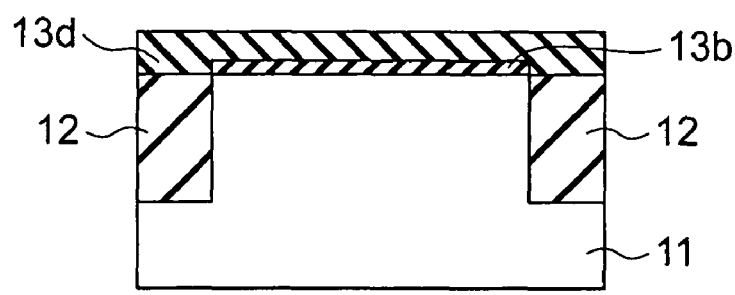

As shown in FIG. 30B, a HfSiO (hafnium silicate) layer 13e of 2 nm to 4 nm in thickness is deposited on the silicon nitride layer 13b by a sputtering technique, CVD method, or ALD method, and heat treatment is carried out to achieve higher quality. Nitrogen is then introduced into the HfSiO layer 13e through plasma nitridation or ammonia nitridation, and after the nitrogen introduction, heat treatment is carried out to activate the nitrogen. The amount of nitrogen to be introduced is the smallest possible amount so as not to cause phase separation or crystallization in the HfSiO layer 13e. In this manner, the HfSiON layer 13d is formed as shown in FIG. 30C.

Figure 30D:
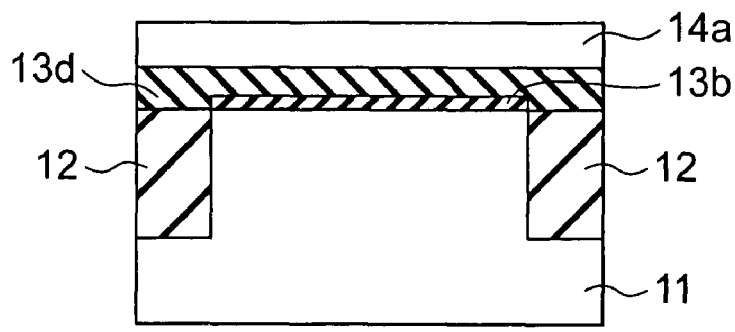

As shown in FIG. 30D, a flat amorphous silicon layer 14a of approximately 20 nm in thickness to be the gate electrode 14 is then formed on the HfSiON layer 13d, with the use of a disilane gas, for example. Nickel (Ni) sputter deposition is then carried out, and heat treatment is carried out at 400° C. Selective etching is performed on unreacted metal. In this manner, the gate electrode 14 made of nickel silicide is formed in a self-aligning manner.

Figure 31A:
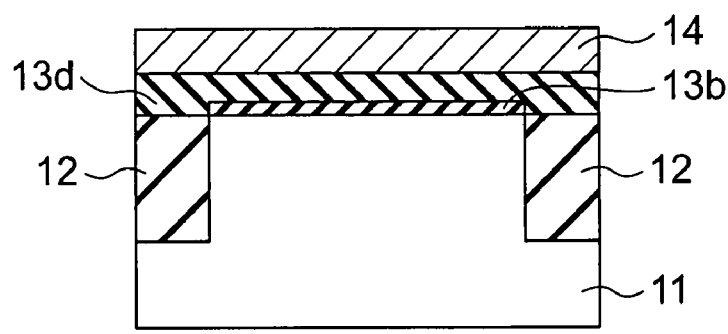
FIGS. 31A through 31D are cross-sectional views showing the procedures for manufacturing the MISFET in accordance with the fifth embodiment.
Figure 31B:
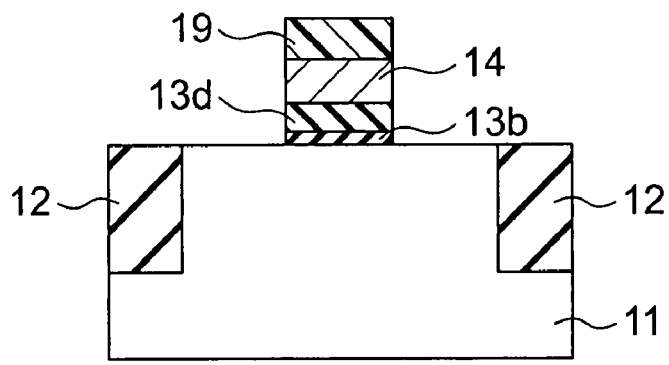
Figure 31C:
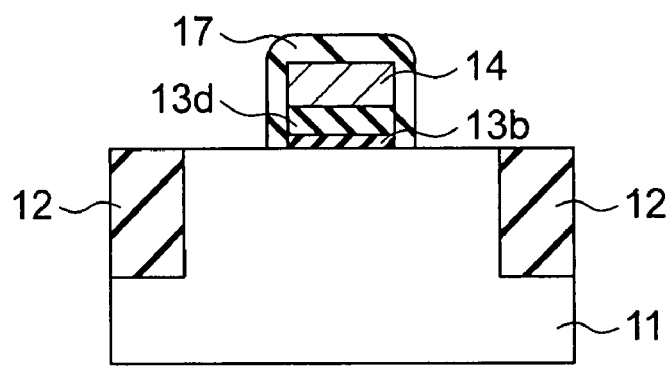

As shown in FIG. 31B, a resist mask 19 of photoresist is formed on the gate electrode 14 by a photolithography technique. With the resist mask 19, reactive ion etching is performed on the nickel silicide film as the gate electrode 14, the HfSiON layer 13d, and the silicon nitride layer 13b. In this manner, the gate electrode unit is formed. As shown in FIG. 31C, after the resist mask 19 is removed, heat treatment is carried out in an oxygen atmosphere for the purpose of recovery from processing damage or the like, and a post-oxidation film 17 of approximately 3 nm is formed.

Figure 31D:
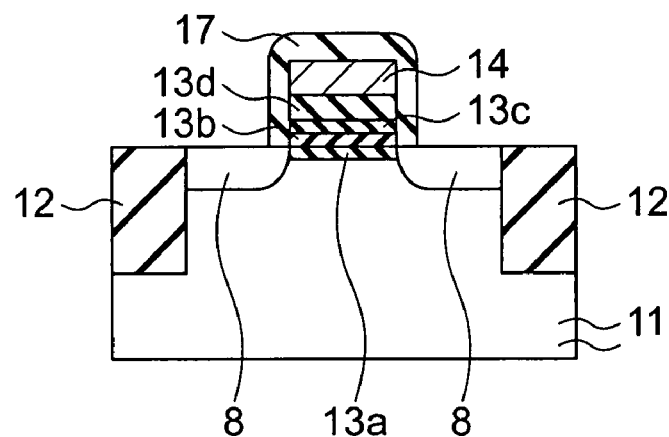

Impurities such as phosphorus ions are then implanted into the entire surface at $3 \times 10^{15}$ cm$^{-2}$, for example. Heat treatment is then carried out at 1000° C. for 20 seconds, for example, so as to diffuse and activate the impurities in the silicon substrate 11. In this manner, the source region 18a and the drain region 18b are formed, and the structure shown in FIG. 31D is obtained. Here, the oxygen desorbed from the HfSiON layer 13d, or the oxygen desorbed from the HfSiO layer 13e during the deposition of the HfSiO layer 13e in the procedure shown in FIG. 30C is turned into the silicon oxide layers 13a and 13c in both interfaces of the silicon nitride layer 13b.

Here, the layer thickness of each of the silicon oxide layers 13a and 13c is affected by the oxygen partial pressure, the oxygen flow rate, and the temperature in the atmosphere in the heating procedure. The layer thickness tends to become larger, as the oxygen partial pressure, the oxygen flow rate, and the temperature become higher. The oxygen desorption should be reduced, so that an ONO stack structure consisting of the silicon oxide layer 13a, the silicon nitride layer 13b, and the silicon oxide layer 13c (SiO$_2$/SiN/SiO$_2$) is formed without breaking the silicon nitride layer 13b having the three-coordinate bonds.

In a case where the silicon nitride layer 13b is formed beforehand in the interface with the silicon substrate 11, as in this embodiment, the interface needs to be oxidized, and the silicon oxygen layer 13a in the interface with the silicon substrate 11 needs to have such a large layer thickness as to eliminate the influence of the fixed charges in the nitride layer 13b, in view of the driving force of the MISFET. This is because the carries in the channel are scattered by the fixed charges in the nitride layer 13b, and the mobility becomes lower accordingly.

Figure 32:
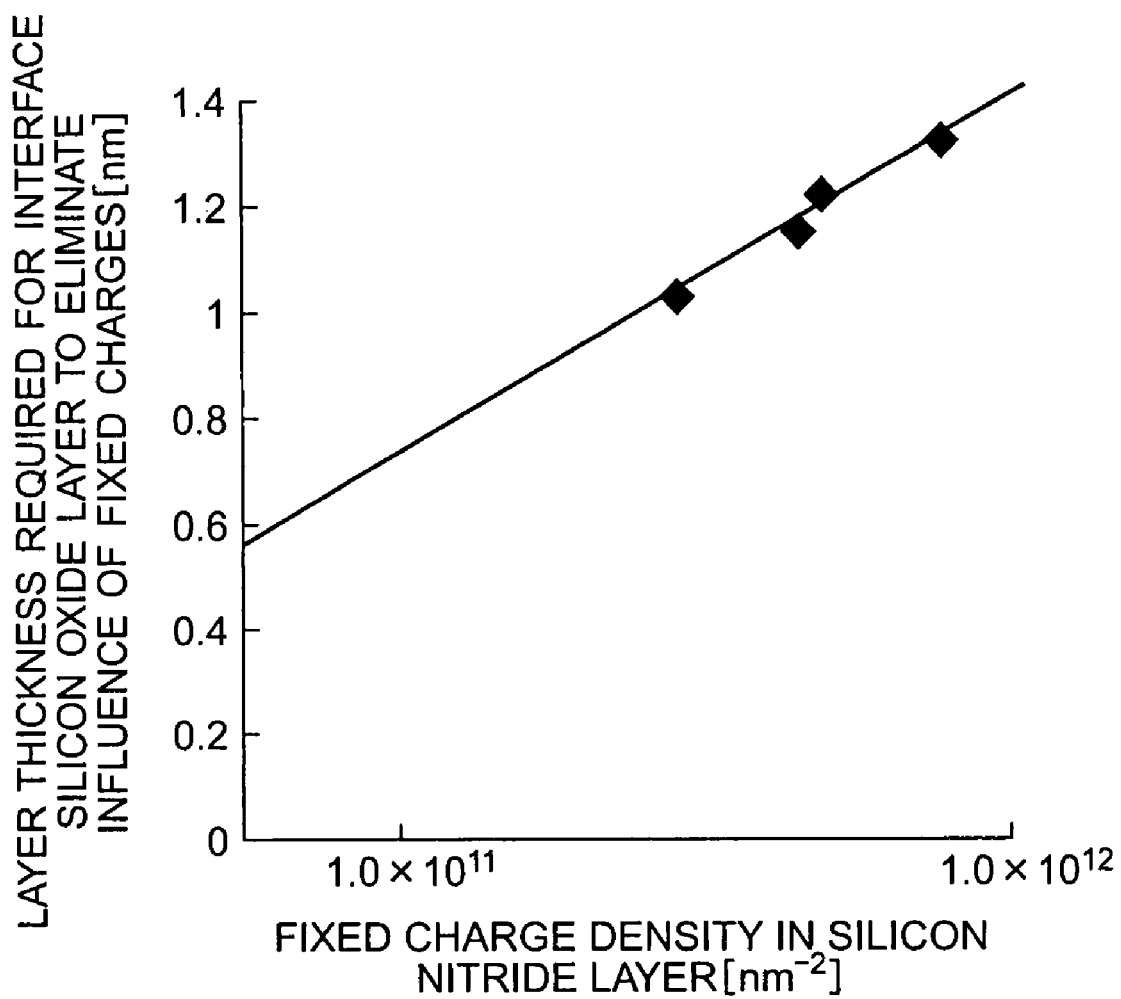
FIG. 32 shows the relationship between the fixed charge density in a silicon nitride layer and the layer thickness required for an interface silicon oxide layer to eliminate the influence of the fixed charges.

FIG. 32 shows the relationship between the fixed charge density in a silicon nitride layer and the layer thickness required for a silicon oxide layer to eliminate the influence of the fixed charges. As can be seen from FIG. 32, if the fixed charge density in the nitride layer is approximately $2 \times 10^{11}$ cm$^{-2}$, the thickness of the silicon oxygen layer in the interface with the silicon substrate needs to be approximately 1 nm. If the fixed charge density in the nitride layer is approximately $5 \times 10^{11}$ cm$^{-2}$, the thickness of the silicon oxygen layer in the interface in the interface with the silicon substrate needs to be approximately 0.5 nm.

Based on the above results, the following expression is established:

$$y = \alpha \cdot Ln(x) - \beta$$

where x represents the fixed charge density in the silicon nitride layer 13b, and y represents the film thickness of the interface silicon oxide layer 13a. Ln is a natural logarithm. The constant $\alpha$ should preferably be equal to or smaller than 0.35, and the constant $\beta$ should preferably be equal to or smaller than 8. By controlling the conditions for oxidation using oxygen desorption so as to satisfy the above relationship, an ONO stack structure with excellent interfacial characteristics can be formed.

Although not specifically shown in the drawings, an interlayer insulating film is then deposited by CVD method, and a contact hole is formed. An aluminum film is deposited to fill the contact hole, and patterning is performed to form an electrode. Heat treatment is then carried out in a nitrogen atmosphere.

The technique utilized in the floating-gate nonvolatile semiconductor memory devices and the MONOS nonvolatile semiconductor memory device of the foregoing embodiments can also be utilized in a MISFET as in this embodiment.

In this embodiment, the temperature in the atmosphere for forming a silicon nitride film in a three-coordinate bonding state is 700° C. However, the temperature may be in the range of 500° C. to 850° C., as long as a three-coordinate bonding state is formed.

In this embodiment, a HfSiON film is described as an example of the high-permittivity gate insulating layer 13d. However, a stack structure consisting of the silicon oxide layer 13a, the silicon nitride layer 13b, and the silicon oxide layer 13c, or the silicon nitride layer 13b may be used as the interface layer in a case where a LaAlO$_x$ (lanthanum aluminate) layer or an Al$_2$O$_3$ (aluminum oxide) layer is employed.

As described above, in a case where a LaAlOx layer or an Al$_2$O$_3$ layer is employed, the silicon nitride layer of this embodiment can restrain mutual diffusion with the Si substrate when heat treatment is carried out for activation. Thus, degradation of the device characteristics can be prevented.

Although a silicon substrate is used in each of the above described embodiments, other semiconductor substrates may be employed.

In each procedure for forming a silicon nitride layer that is continuous in the in-plane direction and has three-coordinate nitrogen bonds and at least one atom among the second-nearest neighbor atoms of the nitrogen, the temperature and pressure for nitridation may be changed if necessary. However, to form a silicon nitride film that is continuous in the in-plane direction ad has three-coordinate nitrogen bonds, it is preferable to set the temperature at 700° C. or lower. At a temperature of 700° C. or higher, it is preferable to set the pressure at 133 Pa or lower. In a case where a polycrystalline silicon layer is nitrided to form a silicon nitride layer, it is preferable to set the temperature at 700° C. and the pressure at 30 Torr or lower.

As described above, in accordance with each of the embodiments of the present invention, a semiconductor device that has a stack structure formed with a silicon layer or a silicon substrate and a high-permittivity layer, and can restrain mutual diffusion between the silicon layer or the silicon substrate and the high-permittivity layer can be provided. Also, a method for manufacturing such a semiconductor device can be provided.

The present invention may be applied to memories, logic circuits, and the likes in which the above described semiconductor elements or nonvolatile semiconductor memory devices are integrated. The present invention may also be applied to system LSIs and the likes each having the above described semiconductor elements or nonvolatile semiconductor memory devices mounted on the same chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a semiconductor device, comprising:
    forming a first insulating film on a semiconductor layer;
    forming a charge storage film on the first insulating film;
    forming a second insulating film made of a high-permittivity film above the charge storage film;
    forming a control gate electrode above the second insulating film;
    forming a silicon nitride layer on at least one of the charge storage film and the second insulating film, the forming the silicon nitride layer comprising:
        depositing a silicon layer; and
        nitriding the silicon layer, using a nitriding gas diluted with a dilution gas that does not react with the semiconductor layer,
    wherein the depositing the silicon layer is performed with a pressure in the range of 0.1 Torr to 40 Torr and at a temperature in the range of 600° C. to 1000° C.

2. The method according to claim 1, wherein the depositing the silicon layer is performed for a longer time than an incubation time in which the silicon layer becomes a continuous film.

3. A method for manufacturing a semiconductor device, comprising:
    forming a first insulating film on a semiconductor layer;
    forming a charge storage film on the first insulating film;
    forming a second insulating film made of a high-permittivity film above the charge storage film;
    forming a control gate electrode above the second insulating film;
    forming a silicon nitride layer on at least one of the charge storage film and the second insulating film, the forming the silicon nitride layer comprising:
        depositing a silicon layer; and
        nitriding the silicon layer, using a nitriding gas diluted with a dilution gas that does not react with the semiconductor layer,
    wherein the ratio between the partial pressure of the nitriding gas and the sum of the partial pressure of the dilution gas and the partial pressure of the nitriding gas is 5 or higher, and the total pressure is 40 Torr or higher.

4. A method for manufacturing a semiconductor device, comprising:
    forming a plate-like semiconductor element region on a substrate;
    forming a first insulating film so as to cover side faces of a portion of the semiconductor element region, the first insulating film being located in a direction perpendicular to the direction in which the semiconductor element region extends;
    forming a charge storage film on the first insulating film;
    forming a second insulating film made of a high-permittivity material above the charge storage film;
    forming a control gate electrode above the second insulating film;
    forming a silicon nitride layer on at least one of the charge storage film and the second insulating film, the forming the silicon nitride layer comprising:
        depositing a silicon layer; and
        nitriding the silicon layer, using a nitriding gas diluted with a dilution gas that does not react with the semiconductor layer,
    wherein the depositing the silicon layer is performed with a pressure in the range of 0.1 Torr to 40 Torr and at a temperature in the range of 600° C. to 1000° C.

5. A method for manufacturing a semiconductor device, comprising:
    forming a plate-like semiconductor element region on a substrate;
    forming a first insulating film so as to cover side faces of a portion of the semiconductor element region, the first insulating film being located in a direction perpendicular to the direction in which the semiconductor element region extends;
    forming a charge storage film on the first insulating film;
    forming a second insulating film made of a high-permittivity material above the charge storage film;
    forming a control gate electrode above the second insulating film;
    forming a silicon nitride layer on at least one of the charge storage film and the second insulating film, the forming the silicon nitride layer including:
        depositing a silicon layer; and
        nitriding the silicon layer, using a nitriding gas diluted with a dilution gas that does not react with the substrate,
    wherein the ratio between the partial pressure of the nitriding gas and the sum of the partial pressure of the dilution gas and the partial pressure of the nitriding gas is 5 or higher, and the total pressure is 40 Torr or higher.

6. The method according to claim 1, wherein the charge storage film includes silicon, and the silicon nitride layer is interposed between the charge storage film and the second insulating film.

7. The method according to claim 1, wherein the control gate electrode includes silicon, and the silicon nitride layer is interposed between the control gate electrode and the second insulating film.

8. The method according to claim 1, wherein the charge storage film is a silicon nitride film.

9. The method according to claim 1, wherein the silicon nitride layer has a layer thickness in the range of 0.4 nm to 1.0 nm.

10. The method according to claim 3, wherein the depositing the silicon layer is performed for a longer time than an incubation time in which the silicon layer becomes a continuous film.

11. The method according to claim 3, wherein the charge storage film includes silicon, and the silicon nitride layer is interposed between the charge storage film and the second insulating film.

12. The method according to claim 3, wherein the control gate electrode includes silicon, and the silicon nitride layer is interposed between the control gate electrode and the second insulating film.

13. The method according to claim 3, wherein the charge storage film is a silicon nitride film.

14. The method according to claim 3, wherein the silicon nitride layer as a layer thickness in the range of 0.4 nm to 1.0 nm.

15. The method according to claim 4, wherein the charge storage film includes silicon, and the silicon nitride layer is interposed between the charge storage film and the second insulating film.

16. The method according to claim 4, wherein the control gate electrode includes silicon, and the silicon nitride layer is interposed between the control gate electrode and the second insulating film.

17. The method according to claim 4, wherein the charge storage film is a silicon nitride film.

18. The method according to claim 5, wherein the charge storage film includes silicon, and the silicon nitride layer is interposed between the charge storage film and the second insulating film.

19. The method according to claim 5, wherein the control gate electrode includes silicon, and the silicon nitride layer is interposed between the control gate electrode and the second insulating film.

20. The method according to claim 5, wherein the charge storage film is a silicon nitride film.

\* \* \* \* \*